(12) United States Patent
Elsayed et al.

(10) Patent No.: US 11,299,986 B2
(45) Date of Patent: Apr. 12, 2022

(54) METHOD FOR ACID FRACTURING AND ACID STIMULATION BASED ON NMR DIFFUSION MEASUREMENTS

(71) Applicant: KING FAHD UNIVERSITY OF PETROLEUM AND MINERALS, Dhahran (SA)

(72) Inventors: Mahmoud Elsayed, Dhahran (SA); Mohamed Mahmoud, Dhahran (SA); Ammar El-Husseiny, Dhahran (SA); Muhammad Shahzad Kamal, Dhahran (SA); Karem Al-Garadi, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 193 days.

(21) Appl. No.: 16/779,923

(22) Filed: Feb. 3, 2020

(65) Prior Publication Data
US 2021/0238998 A1    Aug. 5, 2021

(51) Int. Cl.
*G01V 3/32* (2006.01)
*G01V 3/20* (2006.01)
*G01N 24/08* (2006.01)
*E21B 43/27* (2006.01)
*E21B 49/00* (2006.01)
*E21B 43/26* (2006.01)

(52) U.S. Cl.
CPC .............. *E21B 49/00* (2013.01); *E21B 43/26* (2013.01); *G01N 24/081* (2013.01); *G01V 3/32* (2013.01)

(58) Field of Classification Search
CPC ... G01V 3/32; G01V 3/30; G01V 3/20; G01N 24/081; G01R 33/44; E21B 49/00; E21B 43/27; E21B 43/28
See application file for complete search history.

(56) References Cited

U.S. PATENT DOCUMENTS

| | | | |
|---|---|---|---|
| 5,565,775 A | 10/1996 | Stallmach et al. | |
| 7,253,618 B1 | 8/2007 | Freedman et al. | |
| 8,720,552 B2 * | 5/2014 | Ayan | E21B 49/008 166/250.15 |
| 9,575,203 B2 * | 2/2017 | Chen | G01V 3/32 |

(Continued)

FOREIGN PATENT DOCUMENTS

WO    WO 2013/148516 A1    10/2013

OTHER PUBLICATIONS

A.J. Lucas, et al., "Pore Geometry Information Via Pulsed Field Gradient NMR", Magnetic Resonance Imaging, vol. 12, No. 2, 1994, pp. 249-251.

*Primary Examiner* — Kenneth L Thompson
(74) *Attorney, Agent, or Firm* — Oblon, McClelland, Maier & Neustadt, L.L.P.

(57) ABSTRACT

A method for assessing an optimal acid injection rate in the process of hydrocarbon formation stimulation. The method comprises evaluating an anisotropic diffusion coefficient by pulsed gradient NMR, introduction of a semi-empirical correction based on comparison of the downhole conditions with the library of laboratory experiments where such corrections were measured, extrapolation of the library data to the real downhole conditions. The improved values of the diffusion coefficients are applied in determining wormhole regime conditions that are optimal in terms of acid consumption per a unit of stimulated yield of the hydrocarbon.

12 Claims, 24 Drawing Sheets

(56) References Cited

U.S. PATENT DOCUMENTS

| | | | |
|---|---|---|---|
| 10,197,489 B2* | 2/2019 | McCarty | C09K 8/66 |
| 10,228,335 B2* | 3/2019 | Paulsen | G01N 24/081 |
| 10,590,750 B2* | 3/2020 | Mahmoud | E21B 43/25 |
| 2016/0161630 A1* | 6/2016 | Badri | E21B 49/008 |
| | | | 324/303 |
| 2018/0252087 A1* | 9/2018 | Dinariev | G06T 15/08 |
| 2018/0335494 A1* | 11/2018 | Hakimuddin | G01N 24/081 |
| 2020/0209426 A1* | 7/2020 | Li | E21B 49/0875 |
| 2020/0363357 A1* | 11/2020 | Kortunov | G01N 24/081 |
| 2021/0332686 A1* | 10/2021 | Safariforoshani | E21B 43/255 |

* cited by examiner

| Material | T1 (msec) | T2 (msec) |
|---|---|---|
| Free water | 4000 | 2000 |
| Hydrocarbons | 250 | 70 |
| Water Ice | 5000 | 0.001 |

METHOD FOR ACID FRACTURING AND ACID STIMULATION BASED ON NMR DIFFUSION MEASUREMENTS

STATEMENT OF PRIOR DISCLOSURE BY AN INVENTOR

Aspects of the present disclosure are described in Elsayed et al., "A New Method To Evaluate Reaction Kinetics of Acids with Carbonate Rocks Using NMR Diffusion Measurements", *Energy Fuels* 2020, 34, 1, 787-797 Dec. 24, 2019, incorporated herein by reference in its entirety.

BACKGROUND OF THE INVENTION

Technical Field

The present disclosure relates to a method of acid fracturing and acid stimulation based on NMR measurements of local diffusion, especially acid diffusion.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present disclosure.

Production of shale and/or heavy oil requires proactive approaches such as fracturing and expanding a geological formation containing hydrocarbons by injecting fracturing fluids (e.g., saline) under high hydrostatic pressure (often with added detergents) to displace the hydrocarbons from pores in the formation. Typically, the hydrocarbons are still compressed by the pressure of geological strata above which may exceed the hydrostatic head of the fracturing fluid. This pressure difference coupled with the injection of detergents that function to solubilize crude oil aid in extraction of hydrocarbons that may not otherwise be possible.

Acid treatment increases the diameters of pores in the formation, reduces tortuosity and enables the viscous components to escape the formation following the Darcy-Weisbach equation:

$$\frac{\Delta p}{L} = \frac{128}{\pi} \cdot \frac{\mu Q}{D_c^4}, \quad (1).$$

where $\mu$ is the dynamic viscosity of the fluid (Pa·s=N·s/m²=kg/(m·s)); Q is the volumetric flow rate of the hydrocarbon, used to measure flow instead of mean velocity according to $Q=\pi/4 Dc^2 \langle v \rangle$ (m³/s).

The flow of solubilized hydrocarbons out of the formation is a function of the inverse $4^{th}$ power of the equivalent pore diameter at a given pressure difference and therefore increasing this parameter increases the formation's productivity. At the same time, the acid required for etching of geological formations that include carbonate rocks and which is suitable for such stimulation is often relatively expensive, therefore a careful balancing of the expenditure of valuable chemicals (acid) with the hydrocarbon output determines the timing and spacing of the acid injections (See Jafarpour H, Moghadasi J, Khormali A, Petrakov D G, Ashena R. in *Journal of Petroleum Science and Engineering*, 2019, 172:50-9, Carvalho R T, Oliveira P F, Palermo L C, Ferreira A A, Mansur C R. Fuel. 2019, 238:75-85).

Typically, the acid treatment of a geological formation is carried out with an acidizing blend that includes a mixture of acidic solutions comprising HCl, organic acids (acetic, formic, citric), incorporated in a detergent emulsion that moderates the acid release to provide a desired time-profile. The need for moderating acid release corresponds with the degree of pore opening. The injected solution must have the buffer capacity to dissolve massive quantities of the formation carbonate, but this dissolution should take place in the depth of the formation to avoid consumption of all of the acid in the peripheral regions that first come into contact with the reactants (e.g., a face region, most proximal to the borehole). The ratio of microemulsion penetration in the formation to the reactivity is maximized by emulsification and inclusion of weak organic acids (acetic, citric) providing high buffering and decreasing the reaction rate in already expanded pores. Other critical parameters include the injection velocity and pressure, which may be tailored to push the acid as far as possible into the formation before it is exhausted by the reaction.

The moderated acid penetrates deep in the formation rock and removes or changes the rate-limiting step for hydrocarbons to exit the formation in much larger volumes, according to the Darcy-Weisbach equation. The Darcy relationship points that the bulk of the resistance to the exit of hydrocarbons out of the formation is associated with the smallest diameters of the pores. The depth of penetration of the acidulant in the formation is related to the etching rate at the surface and characterizes the acid's efficiency. This efficiency, however, suffers when the acid is too attenuated so that the pores open too slowly even if the activating emulsion penetrates deeply.

The most preferred regime (e.g., temperature, pressure, flow, etching rate, acid type, etc.) is attained when the acid is delivered rapidly enough and has sufficient reactivity and diffusivity to generate a "wormhole"—a long extensive and wide channel that permits the acid and hydrocarbon to flow more efficiently than a combination of more narrow pores that would otherwise form by consumption of the same amount of acid. The least optimal regime is an immediate reaction of the acid at the front of the formation without in-depth penetration. The formation of homogenous openings of multiple smaller pores is more preferred than acid consumption at the formation front but is less preferred than the formation of wormholes. The regime of wormhole formation is established when most of the acid solution convectively flows through a small group of initially bigger pores and diffuses into the bulk of formation from these vias. A complex interplay between diffusivity, injection velocity and reactivity defines the exact parameters at which the wormholes are the most advantageous.

The acid diffusion coefficient is thus an important term that is required during the matrix acid treatment. For an acidizing treatment, involving a solid rock and a fluid acid system, the reaction rate is greatly affected by reactant (acid) transport to the rock surface and products transport (e.g., dissolved rock) from the inside surface of the pores. Acid diffusion is used to determine the optimum injection rate required to achieve the desirable stimulation treatment results. Acid diffusion controls the treatment soaking time. Especially advantageous are in-situ measurements, allowing mathematical modelling and improvement from empirical datasets (Zhao S, Sun Y, Wang H, Li Q, Guo W. in *Journal of Petroleum Science and Engineering*. 2019, 176:494-501, Chen Y, Ma G, Li T, Wang Y, Ren F., *Computers and*

*Geotechnics*, 2018; 98:58-68; Li N, Kang J, Zhang Q, Wu Y, Zhang H. Mathematical Model of Acid Wormhole Expansion When Combining Diverting Acid with Solid Diverting Agent. *InInternational Petroleum Technology Conference* 2019 Mar. 22 at International Petroleum Technology Conference, Sayed M, Cairns A J, Aldakkan B S, Gomaa A M, Alnoaimi K R. A Low-Viscosity Retarded Acid System for Stimulation of High-Temperature Deep Wells. *In Offshore Technology Conference* 2018 Apr. 30. Offshore Technology Conference).

Models that describe the productivity of oil extraction account for the depth of penetration of the acid, time of action (soaking) at a depth of penetration, the residual content of the acid not yet consumed, and the amount of hydrocarbon released by the introduced additional porosity. The modelling accounts for the other acidizing processes related to fracturing such as well cleaning, scale removal, and filter cake removal.

Proton Nuclear Magnetic Resonance is applicable for the measurement of acid diffusion coefficients in-situ. The initial formula for extraction of diffusion coefficients from the NMR pulse sequence data are provided in Stejskal, E. O.; Tanner, J. E. in the publication titled "Spin Diffusion Measurements: Spin Echoes in the Presence of a Time-Dependent Field Gradient" in the *Journal of Chemical Physics*, 1965, 42 (1): 288 incorporated herein by reference.

$$\frac{S(TE)}{S_0} = \exp\left[-\gamma^2 G^2 \delta^2 \left(\Delta - \frac{\delta}{3}\right) D\right] \quad (2)$$

where $S_0$ is the signal intensity without the diffusion weighting, $S(TE)$ is the signal with the magnetic field gradient, $\gamma$ is the gyromagnetic ratio, G is the strength of the gradient pulse, $\delta$ is the duration of the pulse, $\Delta$ is the time between the two pulses, and finally, D is the diffusion coefficient.

The pulse NMR of Stejskal et. al. is fine-tuned for anisotropic materials and the 13-interval APGSTE sequence (see further description here) is a method of choice, since it envisages the magnetic field pulses in multiple dimensions, therefore measuring diffusion coefficients in different directions, which may differ. The signal attenuation ($S/S_0$) for the 13-interval APGSTE sequence is given by a variation of the Stejskal and Tanner equation (2):

$$\frac{S}{S_0} = \exp\left\{-D_R \gamma^2 \left[\delta^2 \left(4\Delta + 6\lambda - \frac{2\delta}{3}\right) g_a^2 + 2\lambda\delta(\delta_1 - \delta_2) g_a g_0 + \frac{4}{3}\lambda^3 g_0^2\right]\right\} \quad (3)$$

where
$S_0$=NMR signal in the absence of applied magnetic field gradients (µN).
$D_R$=Restricted self-diffusion coefficient of the fluid (m²/s),
$\Delta$ is the duration between two applied magnetic field 'Diffusion Time' (msec),
$\delta$ is the duration of the applied magnetic field gradient (msec).
$\gamma$ is the gyromagnetic ratio of the nucleus being studied (=2.68×10⁸ Hz/T for ¹H nucleus).
$g_a$ is the strength of the applied magnetic field gradient (T/m),
$g_0$=Strength of the internal magnetic field gradient (T/m).
$\lambda$ is the time between the first two ($\pi/2$) RF pulses (msec),
and $\delta_1$ and $\delta_2$=pre- and post-pulse time respectively (msec).

US2014225607 discloses a method for estimating a property of subsurface material by extracting a sample of the material using a downhole formation tester and performing a plurality of nuclear magnetic resonance (NMR) measurements on a sensitive volume in the sample where each measurement in the plurality is performed in a static homogeneous magnetic field with a pulsed magnetic field gradient that is different in magnitude from other NMR measurements to provide a waveform signal. The publication does not disclose downhole applications. The method relies on the extraction of the sample, which is impractical in the emerging drilling conditions when the reaction time is valuable.

US2016109391 discloses a method for measuring a pH of a sample in situ using NMR spectroscopy. The method comprises providing an in-situ NMR pH measurement device. The device includes a sample housing member configured to house a target sample, at least one pH sensor configured to exhibit an NMR spectral change due to a change in pH value of the target sample, and a pH sensor containment member configured to house the at least one pH sensor. The method further comprises adding the target sample to the sample housing member, obtaining one or more NMR spectra, and determining the pH of at least a portion of the target sample. The publication does not disclose a detailed method of measuring restricted diffusivity in a borehole.

Ren et al. in "1H, 13C, and 129Xe NMR Study of Changing Pore Size and Tortuosity During Deactivation and Decoking of A Naphtha Reforming Catalyst" published in *Magnetic Resonance in Colloid and Interface Science* 2002, pp. 603-608, Springer, Dordrecht, disclose 1H, 13C, and 129Xe NMR applied for characterizing the change of the tortuosity, the chemical structure of the coke, as well as the pore size during the deactivation and decoking of a commercial naphtha reforming catalyst (Pt/Re—$Al_2O_3$). The reference mentions APGSTE NMR application and varying acidity of the catalytic sites measured in a porous body. The reference describes a catalyst structure and not a hydrocarbon carrying formation, where the porous medium is consumable.

Isaacs et al. in "Unravelling mass transport in hierarchically porous catalysts" in *Journal of Materials Chemistry* A. 2019; 7(19):11814-25 disclose a family of hierarchical macroporous-mesoporous SBA-15 sulfonic acids that were prepared with tunable macropore diameters for carboxylic acid esterification. Turnover frequencies for long-chain (palmitic and erucic) acids were proportional to macropore diameter (<370 nm), whereas propanoic acid esterification was independent of macropore size. Pulsed field gradient NMR diffusion experiments reveal that larger macropores enhance esterification of bulky carboxylic acids by conferring superior pore interconnectivity and associated mass transport. To minimize the effects of background magnetic field gradients (so-called internal gradients) the diffusion of liquids confined to the porous catalysts was analyzed using the alternating pulsed gradient stimulated echo (APGSTE) pulse sequence. Yet the method does not apply to rock formations in the context of drilling. The catalysts in laboratory conditions and hydrocarbon-bearing formations are different in scale, complexity, reactivity with acids and situational requirements imposed on the equipment and software.

US2003186444 discloses a method for characterizing molecular sieve catalysts by solid-state nuclear magnetic resonance spectroscopy. In particular, the number of acid and non-acid proton sites on molecular sieve catalysts are quantitively determined by solid-state 1H NMR magic angle spinning spectroscopy in the presence of a spin-counting standard. While this reference mentions the determination of local acidity by NMR, solid-state and fluid state NMR are distinct in addition to all factors mentioned above in analysing other references.

Ostlund et al. in "Component-resolved diffusion in multicomponent mixtures. A case study of high-field PGSE-NMR self-diffusion measurements in asphaltene/naphthenic acid/solvent systems" in *Energy & Fuels*. 2004; 18(2):531-8, disclose the diffusion of a multitude of different-sized molecules in various asphaltene mixtures as measured by pulsed gradient spin-echo nuclear magnetic resonance (PGSE-NMR) self-diffusion. The band shapes were calculated and the diffusion for each individual component in the samples was extracted. The band shapes were observed to be in close agreement with the spectra obtained for the pure components.

WO2013148516 discloses the sequential analysis of combinations of at least two different baseline NMR pulse sequence tests, the tests characterized by application of pulse sequences selected from the group consisting of: a Carr-Purcell-Meiboom-Gill (CPMG) pulse echo train; a spin echo pulse; a solid echo; a solid echo train; a free induction decay pulse sequence; an inversion recovery sequence; a saturation recovery sequence; a diffusion measurement; a quantum filter measurement sequence and an internal gradient measurement sequence. The publication discloses the relation of magnetization in the sample with acidity and measuring diffusion using Pulsed-Field Gradient Stimulated Echo. A 90° pulse is used to excite the system. A transient magnetic field gradient is applied for a time δ to the system to impart a phase shift to the precessing spins. The gradient is turned off. After a brief interval, a 90° pulse is applied to store the magnetization along the Z-axis. After an interval to allow the spin-bearing molecules to diffuse, another a 90° pulse is applied to return the magnetization to the XY plane. A transient magnetic field gradient is applied for a time δ to the system to impart a phase shift to the precessing spins again. The second gradient refocuses the magnetization from spin bearing molecules that have not moved since the first transient gradient but will not complete refocus the magnetization from spin-bearing molecules that have moved since the first. This step is repeated with an increased gradient strength to increase the attenuation of the signal. The decrease in signal as the transient gradient is applied encodes the diffusion coefficients of the constituents in the sample. The combined integrated method of applying this element to the improvement of hydrocarbon extraction is not described.

U.S. Pat. No. 7,253,618 discloses a method for determining more accurate diffusion coefficient distributions of reservoir fluids using Bi-polar pulsed field gradients. For use in conjunction with a logging device downhole in an earth borehole, a method for determining a property of a substance in a downhole measurement region, comprising: providing a static magnetic field having a static magnetic field gradient in the measurement region; applying, in the measurement region, a pulse sequence that includes a tipping pulse, a re-focusing pulse, and a pulsed field gradient pulse train, wherein the pulsed field gradient pulses are applied in the following order of polarities: plus, minus, plus, minus. It is shown that by using this bi-polar PFG sequence, accurate diffusion constants can be derived even in the presence of a static magnetic field gradient. The method relies on the bi-polar PFG sequence for making accurate molecular diffusion constant measurements in the flowline of a fluid sampling well logging tool. A train of re-focusing RF pulses may be applied following the echo. The RF pulses produce a train of spin-echoes that provide information on spin-spin relaxation. The publication uses the equation (3) to extract the diffusion coefficients from the NMR data. However, the publication does not determine acidity in the context of acid activation of hydrocarbon-bearing rocks.

US2019277122 discloses a method of acidizing a geological formation and a method of determining an effectiveness of acidizing with NMR spectroscopy. The productivity enhancement after an acidizing operation is a function of the acid penetration radius from the wellbore. Total recovery of productivity after an acidizing operation requires acid penetration up to a certain radius from the downhole. To achieve this high penetration radius, the acid should be injected at the maximum possible injection rates. However, at high injection rates, the rate of acid consumption increases. The relation of the acid injection rate to the acid consumption rate is described by Damkholer number (NDa), which is a ratio between the acid reaction rate to the acid injection rate. The publication further discloses the method of acidizing a geological formation, and a method of determining an effectiveness of the acidizing with NMR spectroscopy, wherein an interconnectivity number is calculated from NMR spectra before and after the acidizing to determine fluid connectivity of wormholes to pores structures of the geological formation. This publication does not mention the specific characteristics of the NMR method.

Hoefner et al. in "Role of acid diffusion in matrix acidizing of carbonates" in *Journal of Petroleum Technology*. 1987; 39(02):203-8, discloses an emulsified acid preparation intended for penetration in the fractures of a carbonate matrix. Acidic diffusivity in this system was measured by Fourier transform nuclear magnetic resonance (NMR) pulsed gradient echo technique. The acidic diffusivity measured by NMR was compared to that measured by a rotating disk. Yet this reference does not disclose applicability to the actual rock formation.

US2012013335 discloses detecting an NMR signal from a drilling fluid and the calculating a physiochemical property of the fluid continuously during the drilling phase. To enable this capability, the steps are automated. The NMR parameters that are measured comprise hydrogen (1H) proton spin relaxation times, i.e. $T_1$, $T_2$ and $T_2^*$, signal amplitudes/intensities, and the translational diffusion coefficient (D), although chemical shift and peak broadening may also be measured. These NMR parameters are measured using spin relaxation time and/or in pulsed gradient spin echo measurements. The additional physiochemical property is viscosity, density, fluid loss control properties; acidity. The method discloses the acidity measurement as one of the many, without a detailed and enabling focus on this parameter by the methods of NMR relaxometry.

US2004189296 discloses a method for obtaining a multi-dimensional proton density distribution from a system of nuclear spins. A plurality of nuclear magnetic resonance (NMR) data is acquired from a fluid containing a porous medium having a system of nuclear spins. A multi-dimensional inversion is performed on the plurality of nuclear magnetic resonance data using an inversion algorithm to solve a mathematical problem employing a single composite kernel to arrive at a multi-dimensional proton density distribution. Conventional logging tools and regular CPMG pulse sequences can be used to obtain a plurality of NMR data when the distribution of proton density is to be obtained in terms of $T_2$ relaxation times and diffusion coefficients D. The proton amplitude data combined with diffusivity of the species may be used to model in-situ acidity. The publication does not disclose assessment of restricted diffusion in real-time during the drilling process.

One objective of the present disclosure is to provide an improved method of acid diffusivity assessment in-situ under dynamic drilling situations in the hydrocarbon-bearing formations undergoing acidification by contact with acidifying emulsions. Real-time responses at a larger scale are linked to hydrocarbon output via relationships of economic efficiency.

SUMMARY OF THE INVENTION

According to a first aspect, the invention relates to an NMR-based method of diffusion coefficient measurement in the actual drilling conditions, when the diffusion of the formation-activating components is coupled to chemical reactions depleting said components and the convective flow, all impacting the observed diffusion measured by NMR.

According to a second aspect, the NMR-based method utilizes gradient fields producing well-defined voxels of the environment's volume around a drilling installation comprising a downhole NMR apparatus. An accompanying software attributes the Fourier transforms of the spin echoes in each voxel to the coordinate, diffusion coefficient and strength of proton signals, indicating the spatial distribution of acidity and porosity in the formation.

According to a third aspect, the NMR-based method utilizes a sequence of 90-degree, 180-degree or partial degree radiofrequency pulses, magnetic gradient pulses of any polarity and direction and a software capable of interpreting the spin-echo data and converting it in the diffusion coefficients.

According to a fourth aspect, the primary NMR-derived diffusion coefficients are corrected by relating the downhole conditions to the pre-made library of corrections validated by an independent rotating disk method of diffusion measurement.

According to a fifth aspect, economic models are provided that relate the quantity of the hydrocarbon product extracted from the activated formation to the quantity of the consumed acidulant, using the empirical real-time calibration measurements provided by the borehole NMR telemetry. The diffusion coefficients measured and adjusted as described in the prior aspects play the central role in these models.

The foregoing paragraphs have been provided by way of general introduction and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
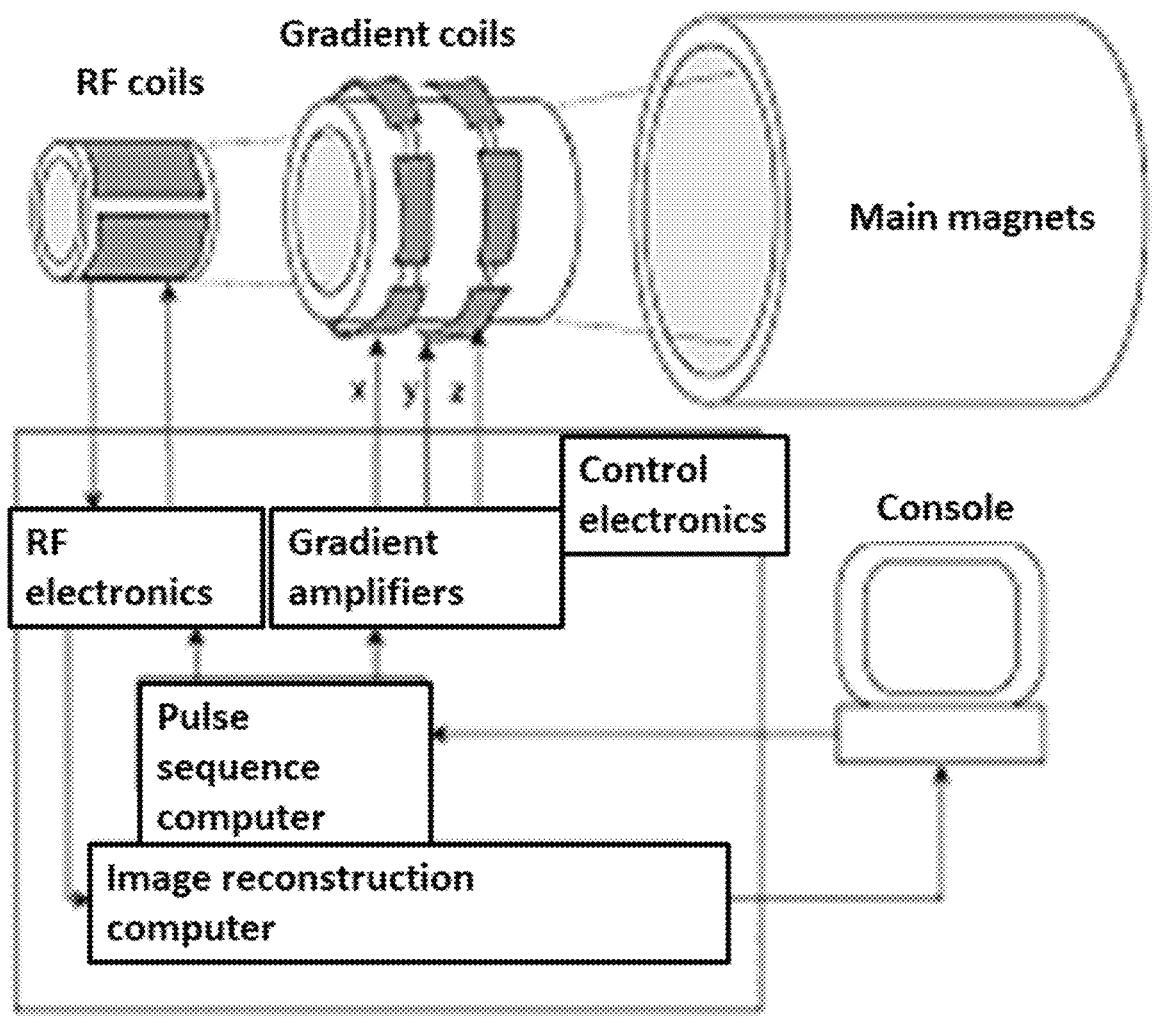
FIG. 1: The basic components of the gradient NMR installation.

Embodiments of the present disclosure will now be described more fully hereinafter with reference to the accompanying drawings, in which some, but not all of the embodiments of the disclosure are shown.

The present disclosure will be better understood with reference to the following definitions.

As used herein, the words "a" and "an" and the like carry the meaning of "one or more". Additionally, within the description of this disclosure, where a numerical limit or range is stated, the endpoints are included unless stated otherwise. Also, all values and subranges within a numerical limit or range are specifically included as if explicitly written out.

As used herein, the terms "optional" or "optionally" means that the subsequently described event(s) can or cannot occur or the subsequently described component(s) may or may not be present (e.g. 0 wt %).

As used herein, the term "flip" and "flip angle" refers to the change in the orientation of the nuclear magnetic momenta in the primary magnetic field due to the absorption of radiofrequency pulse. The resulting macroscopic magnetic momentum gyrates with the resonant Larmor precession rate producing the signal detectable by a separate or the same radiofrequency coil (that produced the said pulse).

As used herein, the terms "collective", "global' and "macroscopic" are equivalent when referred to a transverse magnetization vector M, also mentioned as "net magnetization".

As used herein, the term T1 relaxation refers to re-orientation of the nuclear spins in the direction of the primary magnetic field along the axis Z form the transverse orientation in the plane X0Y perpendicular to the axis Z. As a result, the global magnetization vector turns by 90 degrees and aligns with Z.

As used herein, the term T2 relaxation refers to de-cohering of the spins in the transverse orientation to the primary magnetic field, after absorbing the energy of the RF pulse. The resonance nature of the energy transition leads to the same phase of precession for all spins and therefore the maximal possible transverse magnetization M value. Because of passing energy to the environment and field inhomogeneities, the individual magnetic momenta begin precession in different phases. The global magnetization minimizes, even without considering the re-orientation by the T1 mechanism.

As used herein, the term "spin echo" refers to the process of producing the maximal NMR signal after the RF pulse is turned off, explaining the term "echo". The phenomenon arises due to the presence of leading and lagging elements measured relative to the position of the global transverse magnetization vector M. Some spins "flip" first and some remain aligned with the primary field producing the lagging elements. The additional energy is supplied producing 180 degrees flip. In that stronger transverse magnetization environment, the individual spins feel the local field M as well as B and become synchronized in M not unlike the iron spin domains in a ferromagnetic after the magnetizing current is turned off Since this focusing leads to maximization of the signal and takes place after the excitation energy is not provided any more, it was termed "echo".

As used herein, the term "NMR-derived diffusion coefficient" refers to the process of producing a signal in the detector coil by supplying RF energy to produce 90 degree or lower flip angle, destroying the signal by forcefully decohering the transverse magnetization vector by a magnetic gradient pulse, waiting a pre-set interval of time for the initial phase-labelled population of spins to diffuse away, refocusing the phase-labeled spins by a combination of a RF pulse and a magnetic gradient pulse. Phase-labeling means that that the spins that interacted with the first pair of RF and magnetic pulses will interact with the second pair, restoring the signal. The described process, with variations, is termed "a sequence". The difference between the initial and the restored signal can be related to the diffusion coefficient by the Stejskal and Tanner sequence equations.

As used herein, the term "Sherwood criterion" is a dimensionless invariant $$Sh = \frac{h}{D/L} = \frac{\text{Convective mass transfer rate}}{\text{Diffusion rate}},$$

L is a characteristic length (m)
D is mass diffusivity (m2·s-1)
h is the convective mass transfer film coefficient (m·s-1)
The Sherwood criterion describes the ratio of the convective mass transfer rate to the diffusional mass transfer rate in a complex system, As used herein, the term "Schmidt criterion" is a dimensionless invariant defined as the ratio of the shear component for diffusivity viscosity/density to the diffusivity for mass transfer D. It physically relates the relative thickness of the hydrodynamic layer and mass-transfer boundary layer.

$$Sc = \frac{\nu}{D} = \frac{\mu}{\rho D} = \frac{\text{viscous diffusion rate}}{\text{molecular (mass) diffusion rate}}$$

where:
$\nu$ is kinematic viscosity m2/sec
D is the mass diffusivity (m2/s).
$\mu$ is the dynamic viscosity of the fluid (Pa·s or N·s/m$^2$ or kg/m·s)
$\rho$ is the density of the fluid (kg/m$^3$).

As used herein, the term "wormhole" refers to a long duct produced in a carbonate formation by the stream of rapidly injected acidulant. Such ducts are optimal for increasing the productivity of the formations per a unit of consumed acid.

FIG. 1 presents the simplified scheme of a typical apparatus for modern NMR analysis. The installation comprises the main magnet, the gradient coils, the radiofrequency (RF) coils, RF electronics, gradient amplifiers, control electronics, operator console, pulse sequence computer and image reconstruction computer. In operation, the main magnet produces a strong magnetic field in the range 0.5-3 Tesla. The gradient coils superimpose the additional (+) or (−) 0.1 Tesla contributions in the direction transverse to the axis Z (the axis of rotation inside the main magnet, the axis Z is aligned with the direction of the main magnetic field). Typically, one gradient is created in the direction of the axis X and another in the direction of Y. The extent of the gradient varies along Z. The result of the gradient application is partitioning of the space within the combined magnetic fields into small elements—voxels, which produce the diverse and voxel-specific resonance conditions. Based on Fourier series deconvolution it is possible to trace the spin echoes to the individual voxels (see below) and therefore reconstruct the spatial orientation of the factors affecting the signal magnitude (concentrations) and relaxation times (diffusion coefficients).

The magnetic fields interact with the nuclei possessing uncompensated spins (odd number of protons or neutrons, counted separately in a nucleus). The spins are quantum qualities, but they manifest empirically as circular currents running around the nuclei at very high velocity and creating magnetic momenta, expressed as a product of the current by the area of the conductive contour (Amper×m²). The momenta are vector values and behave at a schematic level analogously to a macroscopic frame with an electric current placed in a magnetic field. Such a frame will align its normal vector ("magnetic momentum vector") with the direction of the field (axis Z), the macroscopic frame will "freeze" perpendicularly to the field.

The nuclei suitable for NMR comprise, without limiting, the following list of isotopes: $^{27}$Aluminium, $^{39}$Argon, $^{75}$Arsenic, $^{135}$Barium, $^{137}$Barium, $^{9}$Beryllium, $^{209}$Bismuth, $^{10}$Boron, $^{11}$Boron, $^{79}$Bromine, $^{81}$Bromine, $^{111}$Cadmium, $^{113}$Cadmium. $^{43}$Calcium, $^{13}$Carbon, $^{133}$Cesium, $^{35}$Chlorine, $^{37}$Chlorine, $^{53}$Chromium, $^{63}$Copper, $^{65}$Copper, $^{59}$Cobalt, $^{2}$Deuterium, $^{19}$Fluorine, $^{69}$Gallium, $^{71}$Gallium, $^{73}$Germanium, $^{3}$Helium, $^{1}$Hydrogen, $^{2}$Hydrogen, $^{3}$Hydrogen, $^{113}$Indium, $^{115}$Indium, $^{127}$Iodine, $^{57}$Iron, $^{83}$Krypton, $^{138}$Lanthanum, $^{139}$Lanthanum, $^{207}$Lead, $^{6}$Lithium, $^{7}$Lithium, $^{25}$Magnesium, $^{55}$Manganese, $^{199}$Mercury, $^{201}$Mercury, $^{95}$Molybdenum, $^{97}$Molybdenum, $^{21}$Neon, $^{61}$Nickel, $^{14}$Nitrogen, $^{15}$Nitrogen, $^{187}$Osmium, $^{189}$Osmium, $^{17}$Oxygen, $^{31}$Phosphorus, $^{195}$Platinum, $^{39}$Potassium, $^{40}$Potassium, $^{41}$Potassium, $^{1}$Proton, $^{103}$Rhodium, $^{85}$Rubidium, $^{87}$Rubidium, $^{45}$Scandium, $^{77}$Selenium, $^{29}$Silicon, $^{107}$Silver, $^{109}$Silver, $^{23}$Sodium, $^{87}$Strontium, $^{33}$Sulfur, $^{123}$Tellurium, $^{125}$Tellurium, $^{115}$Tin, $^{117}$Tin, $^{119}$Tin, $^{47}$Titanium, $^{49}$Titanium, $^{3}$Tritium, $^{183}$Tungsten, $^{235}$Uranium, $^{50}$Vanadium, $^{51}$Vanadium, $^{129}$Xenon. $^{131}$Xenon, $^{67}$Zinc. Of note, deuterium (2H) has the spin value +1, despite having an even number of protons and neutrons. However, the Pauli principle guiding filling of energy levels in all quantum systems applies to each particle type individually; therefore the combination of a proton and a neutron with parallel spins is not banned at the same energy level and has a lower energy than an antiparallel combination, explaining the almost exclusive dominance of the triplet deuterium vs. a possible singlet state with the antiparallel spins. By contrast, two neutrons or two protons at the same energy level must have antiparallel mutually compensating spins being of the same nature.

The magnetic momenta of the nuclei should ideally align strictly along the axis Z, following the direction of the magnetic field B. However, this is impossible due to thermal motion conferring variable quantity of torque to the spinning nuclei, oriented in the magnetic field. Analogously to a mechanical toy "spinning top" or a gyroscope in gravitational fields, the introduction of the torque by the external forces alters the orbital momentum of the spinning system.

Newton's second law of motion can be expressed mathematically, $$F = m \times a \quad (4)$$

or force=mass×acceleration. The rotational equivalent for point particles may be derived as follows:

$$L = I \times \omega \quad (5)$$

Wherein I—is the momentum of inertia and ω—is the angular velocity. Thus, the torque τ (i.e. the time derivative of the angular momentum) is given as:

$$\tau = (dI/dt) \times \omega + I \times (d\omega/dt) \quad (6)$$

The equation (6) is the rotational analogue of Newton's Second Law and the torque is not always proportional or parallel to the angular acceleration. The external torque introduces a perpendicular component to the original orbital momentum $L_z$ of the body spinning relative to the axis Z. Under the stationary conditions, this permanent perpendicular component is directed along the tangent to a circular trajectory of motion accepted by the top of the spinning body. The circular motion that establishes after reaching the stationarity phase (after dampening of nutational motion at the non-stationary phase) is termed precession. More than one precession motions are possible simultaneously, but for simplicity, only one is assumed in the plane X0Y, normal to the axis Z. Under these simplifying assumptions, the precession angular velocity is:

$$\omega_p = \frac{mgr}{I_s \omega_s} = \frac{\tau}{I_s \omega_s} \quad (7)$$

$$T_p = \frac{4\pi^2 I_s}{mgrT_s} = \frac{4\pi^2 I_s}{\tau T_s} \quad (8)$$

Where $\omega_p$—is the precession movement angular velocity, $T_p$—precession movement period, $I_s$—is the inertia momentum vs. the spinning axis, $\omega_s$—is the angular velocity vs. the spinning axis, τ is the applied torque. Analogously to mechanical systems, a spinning particle in a magnetic field experiences a precession movement due to its interactions. When a magnetic moment μ is placed in a magnetic field B, it experiences a torque which can be expressed in the form of a vector product:

$$\tau = \mu \times B \quad (9)$$

Where μ is the magnetic momentum and B is the magnetic field. For the momentum coinciding with B, the torque is zero but is non-zero for a system permuted by thermal motion or charge-charge interactions. When a torque is exerted perpendicular to the angular momentum L, it produces a change in angular momentum ΔL which is perpendicular to L, causing it to precess about the Z-axis. Labelling the precession angle as φ, we can describe the effect of the torque as follows:

$$\tau = \frac{\Delta L}{\Delta t} = \frac{L \sin\theta \Delta\phi}{\Delta t} = |\mu B \sin\theta| = \frac{e}{2m_e} LB\sin\theta \quad (10)$$

The L sin θ is the projection of the original orbital momentum L aligned with the axis Z onto the perpendicular plane X0Y as a result of torque. ΔL is the change of orbital momentum, and this change is equal to a vector difference ΔL between the component L sin θ at the time $t_1$ and the same component at the time $t_2$, resulting due to covering the angle Δφ in the precession. Also, $\mu = (e/2m_e) L$—the equation (10) provides a link between torque expressed through magnetic momentum and its equivalent expressed through angular momentum, both being proportional via gyromagnetic ratio ($e/2m_e$).

Considering the definition of torque according to (9) and elementary transformations produces the final form (11) below. The precession angular velocity (Larmor frequency) is $$\omega_{Larmor} = \frac{d\phi}{dt} = \frac{e}{2m_e} B \quad (11)$$

The analysis of (9)-(11) shows that both the original orbital momentum L and the perpendicular component L sin θ induced by the external torque are canceling in the final expression (11). This canceling is absent in the mechanical analogy above. The resulting precession frequency is inversely proportional to the inertia $m_e$ of the spinning particle, directly proportional to the charge e and the strength of the magnetic field B. The Larmor precession frequency is a characteristic of a particle in a magnetic field and does not reflect the strength of the permutations causing deflections from the axis Z (L sin θ is canceled). Yet as a quantum system, a single particle in this minimal energy state would absorb electromagnetic energy at the same frequency as Larmor precession.

A mechanical analogy is helpful to illustrate why the resonance condition is reached at the Larmor frequency. Assuming a heavy spinning top with an infinite momentum of inertia and periodic impacts by an external force, the energy transfer is the most effective when the period between the impacts is exactly equal to the period of precession. Moving from a laboratory coordinate system to the one originating in the precession spinning top leads to the external force arriving at different positions on the precession trajectory if the periods between the impacts and the precession period are different. Over an extended timeframe, the positions of impacts will find the opposing and equal counterparts, thus mutually neutralizing. For equal periods, the impacts arrive always at the same position, leading to the maximized accumulation of the transferred energy. The similar principle of the external force applied at the inner or natural frequency of oscillations defines the better-known conventional resonance.

Figure 2:
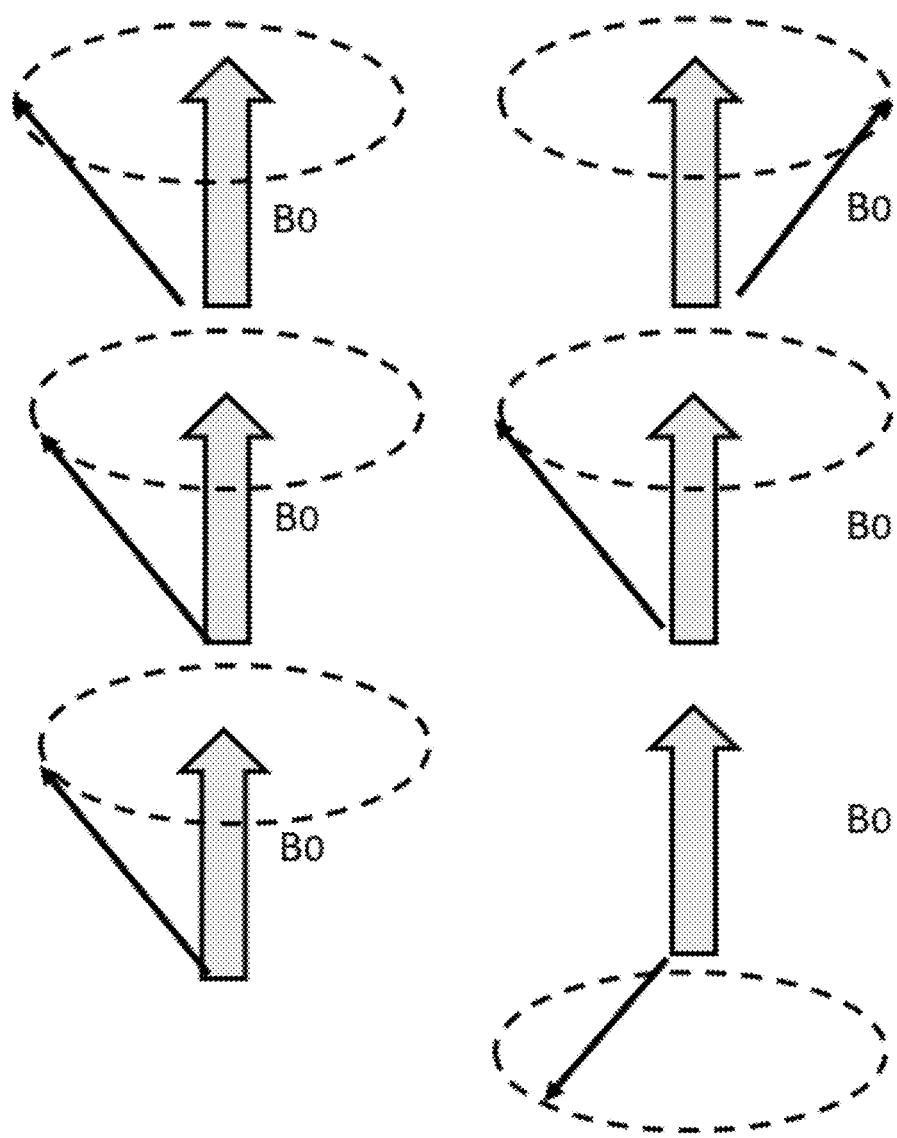
FIG. 2: The scheme of 90 degree flipping and synchronization for the global magnetization vector.

The individual nuclei oriented along the field B are at the minimal energy and when excited by the electromagnetic wave originating in the radiofrequency coils (RF coil), they experience a resonance transition and "flip" the spins in the opposite direction (against the field). This process is time-dependent, and with longer exposure to the excitation energy at the frequency of Larmor precession, the progressively greater proportion of the individual nuclei changes orientation. If originally the summary magnetization vector (vector sum of all individual magnetic momenta) was directed along the axis Z with the field, upon "flipping" the summary magnetization vector rotates by 90, 180 or an arbitrary optimized angle without limitation. FIG. 2 demonstrates the scheme of "flipping" by 90 degrees of the collective magnetization vector.

According to FIG. 2, the initial orientation of the magnetic momenta is random for the nuclei in the background state (aligned with the field with Boltzmann equilibrium distribution describing the population of the energy levels). The only net magnetization component is the difference between the populations of the background and the excited states, with the predominant population in the background state (spin polarization). The upper position in FIG. 2 describes this stage. Upon sensing the RF pulse, the system gains energy by the alignment of the magnetic momenta in the same phase (lower entropy state, middle position). This phase coherence is a general property of resonance absorbance. For example, all mechanical pendulums experiencing resonance by the same external force are also expected to swing in the same phase. Also, the proportion of the energy levels changes due to the quantum transition to the excited states, corresponding to flipping some of the spins shown in the lowest position of the figure. The resulting "flipped" collective magnetic vector is the original collective magnetic vector turned by 90 degrees. In this orientation the net magnetic flux of the sample gyrates in the contour of the RF coils with the Larmor frequency, producing the maximal initial post-flip signal current. The current represents the decaying oscillations which reflect dephasing and relaxation of the high-energy magnetized state after RF pulse is turned off. The signals are proportional to the square of the primary magnetic field and directly proportional to the molar percent of the resonating nuclei. The signals can also be deconvoluted as exponential decays with the relaxation times T1 and T2, providing the most useful information about the state of the system. T1 relaxation is the process by which the net magnetization (M) grows/returns to its initial maximum value (Mo) parallel to Bo in FIG. 2. Synonyms for T1 relaxation include longitudinal relaxation, thermal relaxation and spin-lattice relaxation. The net magnetization along Z is zero during the action of the RF pulse due to the M vector flip. The net magnetization returns back to its Boltzmann distribution maximum by the equation:

$$M_t = M_{max}(1 - e^{-t/T1}) \quad (12)$$

Where $M_t$ is the magnetization at time=t, the time after the 90° pulse, $M_{max}$ is the maximum magnetization at full recovery. This type of relaxation was termed "spin-lattice" due to lattice or other external environments being the acceptors of the excessive energy in the magnetized material.

As the individual magnetization vectors align with the primary magnetic field, they simultaneously de-cohere since the completely random orientation of the precessions are more favourable energetically as a more probable state with higher entropy. T2 relaxation is the process by which the transverse components of magnetization (Mxy) decay or dephase. T2 relaxation is considered to follow first-order kinetics, resulting in a simple exponential decay (like a radioisotope) with time constant T2. Thus, T2 is the time required for the transverse magnetization to fall to approximately 37% (1/e) of its initial value. Synonyms for T2 relaxation are transverse relaxation and spin-spin relaxation (See Bloch F. Nuclear induction. *Phys Rev* 1946; 70:460-474, 1946, incorporated herein by reference in entirety). T2 relaxation occurs whenever there is T1 relaxation. Some additional processes also exist (such as static local fields and spin "flip-flops") that cause T2 relaxation without affecting T1. T2 relaxation always proceeds at a faster rate than T1 relaxation.

Figure 3:
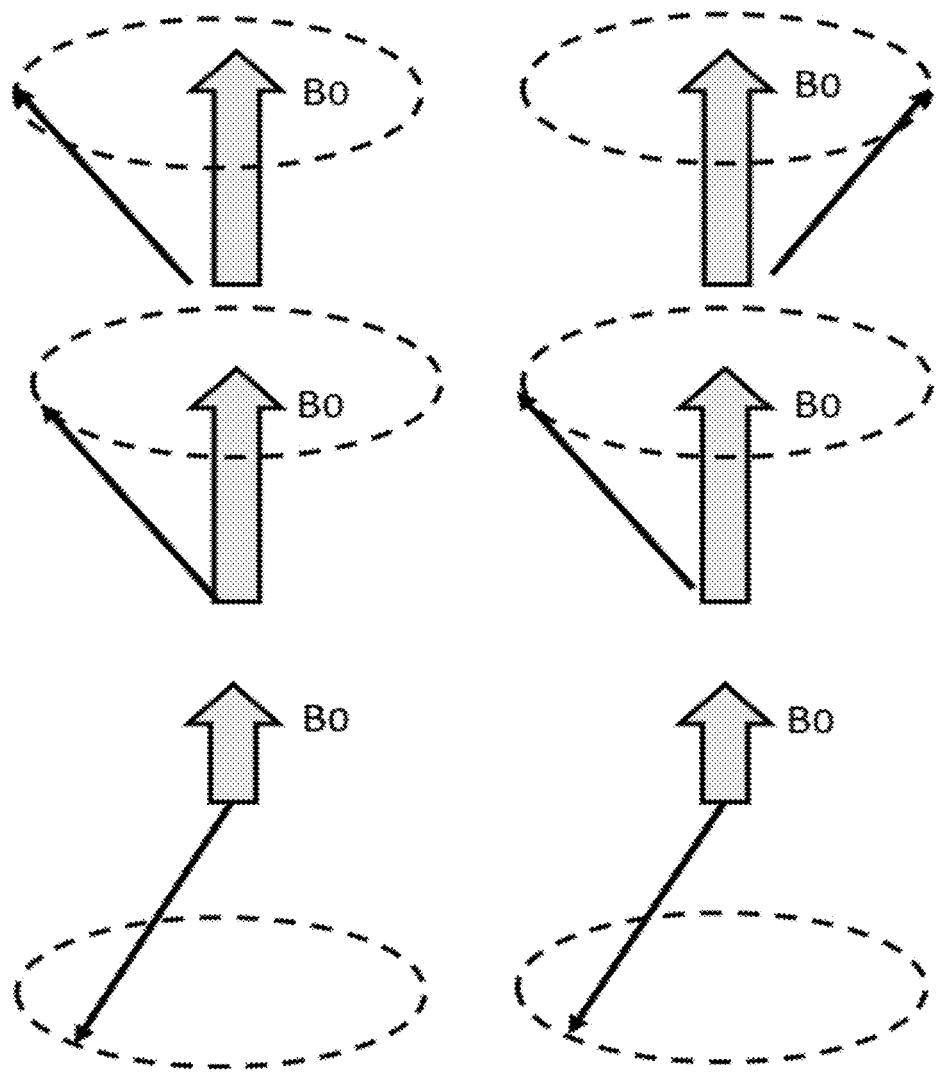
FIG. 3: The scheme of 180 degree flipping and synchronization for the global magnetization vector.
Figure 4A:
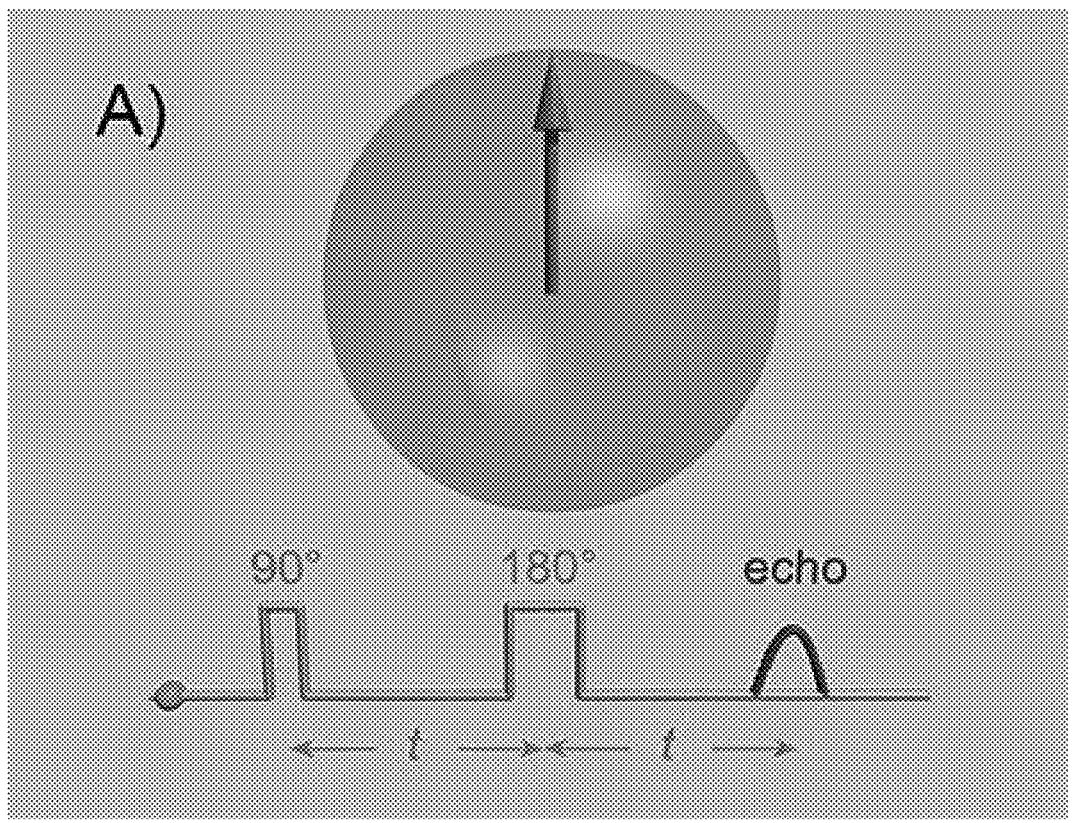
FIG. 4A. The initial orientation of the magnetization vector up-field.
Figure 4B:
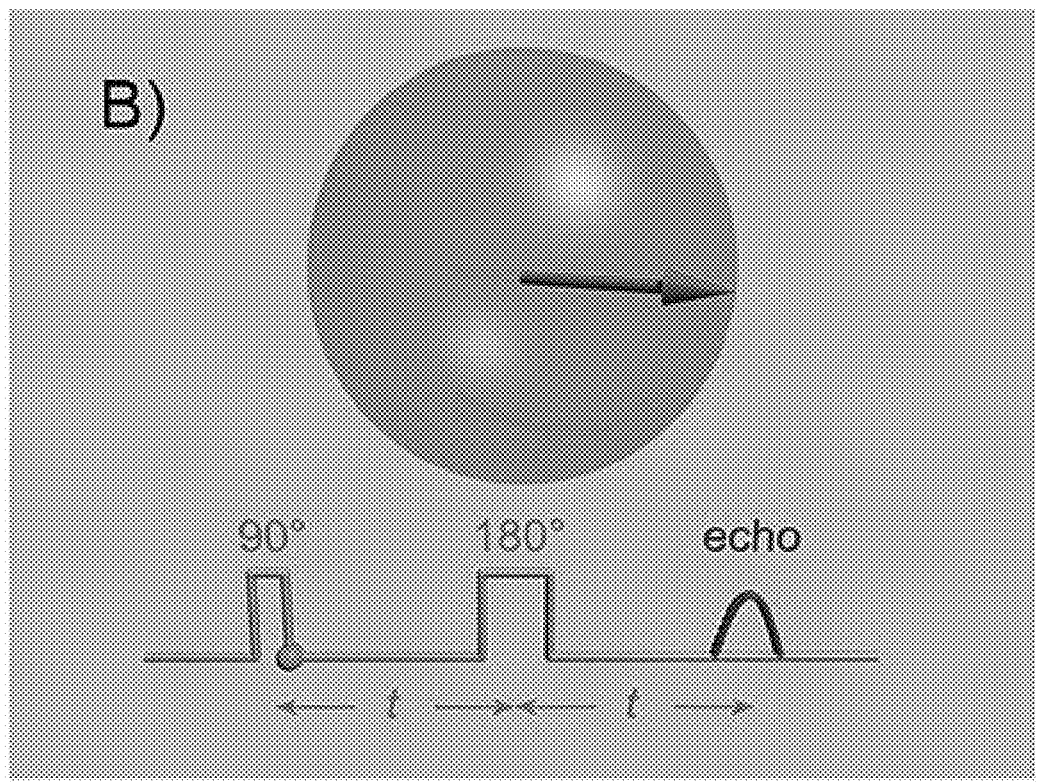
FIG. 4B. The initial focusing after the completion of 90 degree "flip".
Figure 4C:
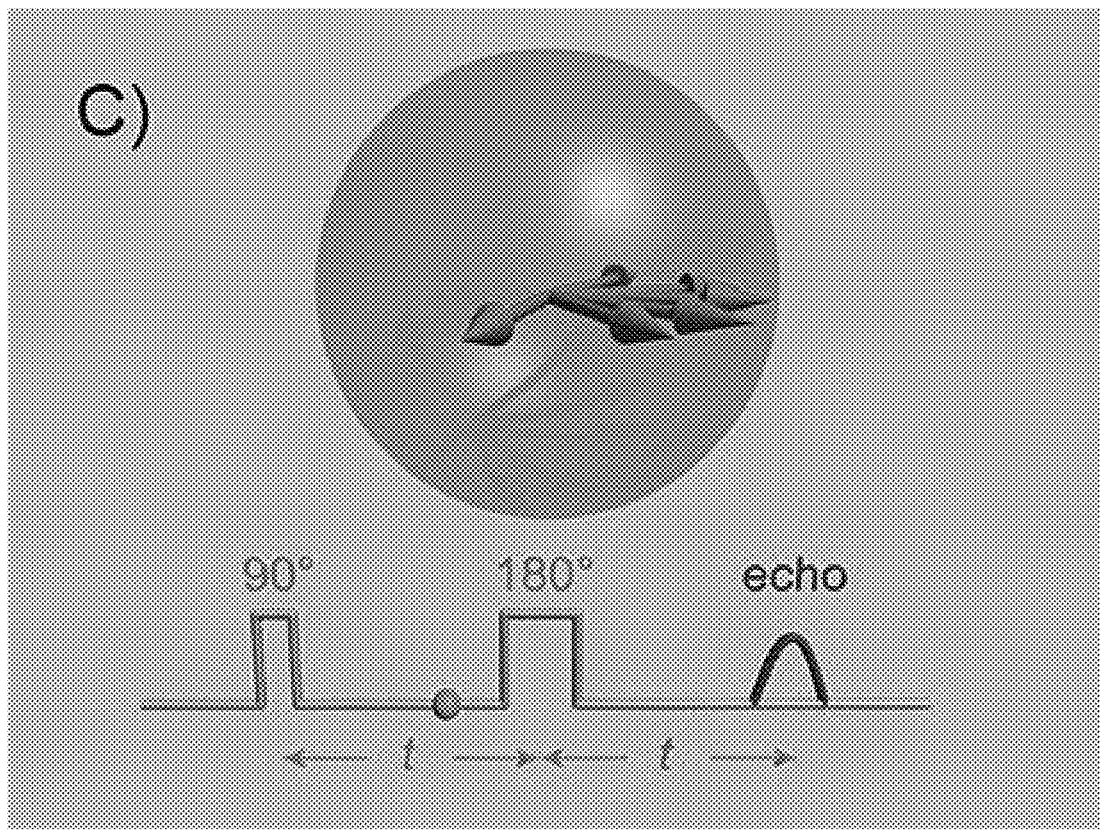
FIG. 4C. Relaxation of spins post 90-degrees focusing. Faster elements lose coherence first, while the lagging remain focused.
Figure 4D:
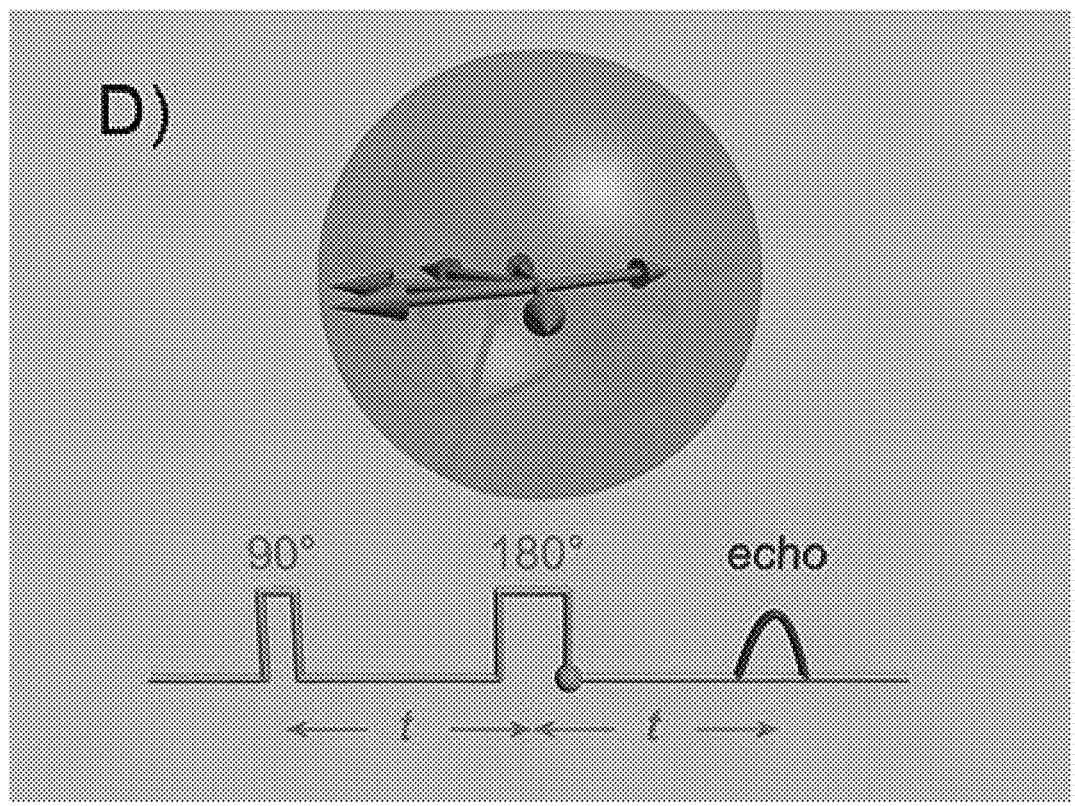
FIG. 4D. After RF irradiation from the opposite direction the former invisible elements (in 4C) become leading, face the detector coil and produce a signal. The former visible elements become lagging and are invisible.
Figure 4E:
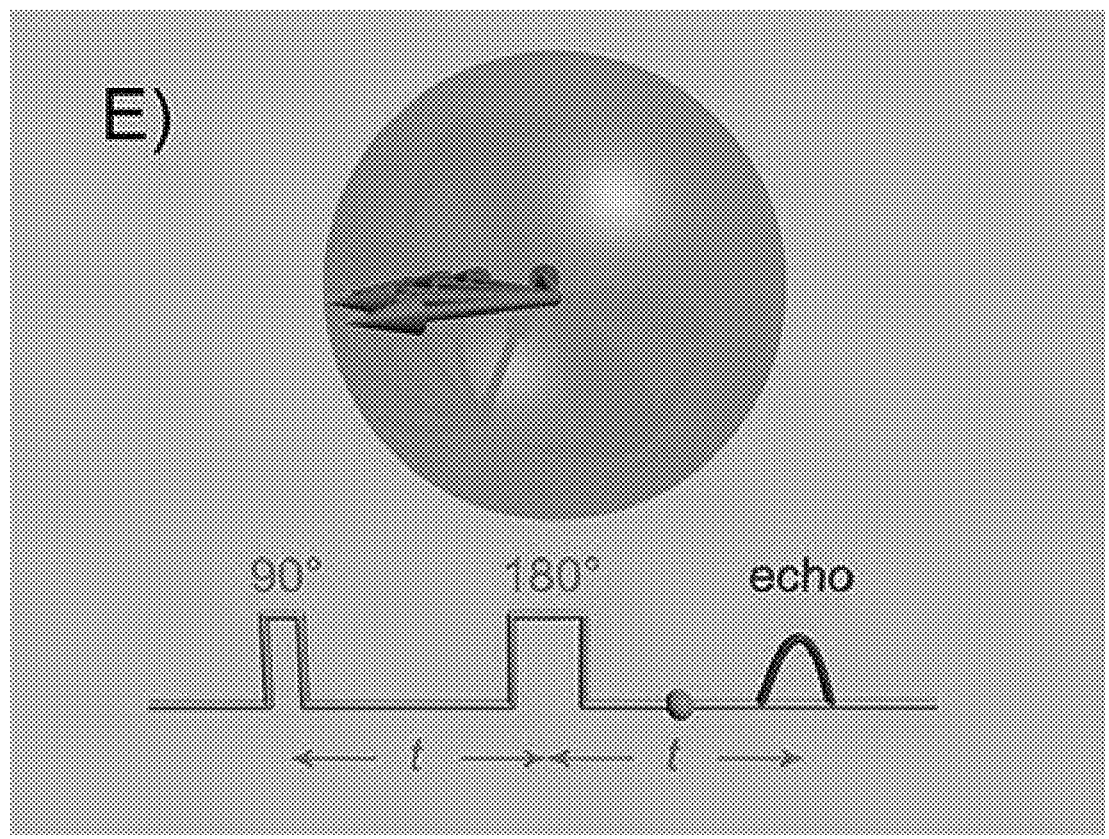
FIG. 4E. From the initial 90 degree "flip" of FIGS. 4B and 4C, the global vector first turns by 90 degrees vs, 4B and 4C (or 180 degrees vs 4A) and next additional 90 degrees, arriving at the arrangement as shown. After disconnection of RF energy, the individual magnetization vector continues synchronizing in the global transverse magnetization field M (as they do in $B_0$ in 4A), reaching a refocusing point later in time.
Figure 4F:
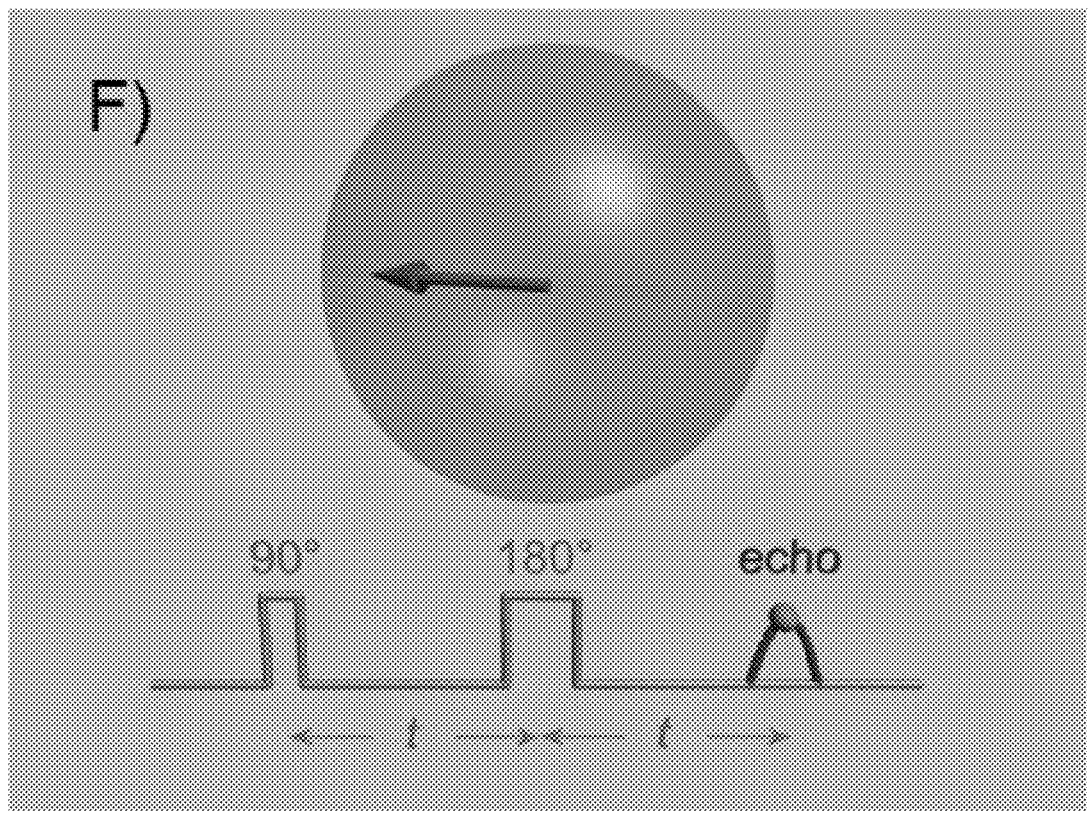
FIG. 4F. From the initial 90 degree "flip" of FIGS. 4B and 4C, the global vector first turns by 90 degrees vs, 4B and 4C (or 180 degrees vs 4A) and next additional 90 degrees, arriving at the arrangement as shown. The lagging elements continue to move in the transverse magnetic field M even when the RF energy is shut down, in the same sense as they converge in $B_0$ field in 4A. The field M acts more on the lagging elements and less on the leading elements, contributing to focusing of the signal in phase, observing "echo", even when RF is turned off.

FIG. 3 presents vector diagrams of the individual nuclei explaining acquisition of the 180 "flip angle" in the collective magnetization state. Such "flip" angles require twice as much energy absorbed by the sample from the RF pulse, due to either longer duration or higher intensity of the excitation pulsing. If in case of 90 degree "flip", the individual magnetization vectors are coherent and 50% are in the excited state (producing transverse orientation of the global vector, see FIG. 2), in case of 180 degree "flip" 100% of the individual nuclei are in the excited state. Upon reaching the exact 180 "flip", no transverse precession of the global magnetization vector takes place and the receiving RF coil detects no signal. Only after relaxation begins, the global magnetization vector begins to approach the 90 degree "flip" angle when the signal is maximized before it begins to decay. Simultaneously with the T1 relaxation, decoherence and T2 relaxation takes place all the way from the 180 degree "flip" to the final "flip" state (see below). The 180 degree regime produces more complex relaxation patterns and communicates qualitatively different information supplementing the lower degree regimes. In any real NMR experiment, however, the transverse magnetization decays much faster than would be predicted by natural atomic and molecular mechanisms; this rate is denoted T2* ("T2-star"). T2* can be considered an "observed" or "effective" T2, whereas the first T2 can be considered the "natural" or "true" T2 of the formation being imaged. T2* is always less than or equal to T2. T2* results principally from inhomogeneities in the main magnetic field. These inhomogeneities may be the result of intrinsic defects in the magnet itself or from susceptibility-induced field distortions produced by the formation or other materials placed within the field.

The 180 degree "flips" can be measured not only vs. the original up-field orientation of the magnetization vector but vs. the initial 90 degree "flip" in the sophisticated "spin echo" sequences of the present invention. FIG. 4A-F demonstrates such an interpretation of the 180 degree "flip".

Ideally, in each voxel of the apparatus space, all points should experience the same magnetic field and the same synchronized resonance conditions. However, inhomogeneity of the main magnetic field ("shimming"), local field shielding at some nuclei by valence electrons, different kinetics of re-orientation create a distribution of resonance frequencies. Some individual nuclei experience the spin "flip" earlier at lower delivered energy, some proceed together with the population average and some lag behind requiring a greater RF energy inputs to "flip". As a result, not all components participate in formation of NMR signal, since some "overshoot" the transverse spin orientation in the plane X0Y that is a prerequisite for signal detection, while the others remain in the original Z-axis aligned orientation. Thus, the information about the properties of these components remains unavailable, and the overall analysis becomes incomplete.

The application of saturating levels of RF energy leading to the 180 degree "flips" and "spin echo" phenomena addresses these problems (See Malcolm H. Levitt; Ray Freeman "NMR population inversion using a composite pulse". *Journal of Magnetic Resonance*, 1979, 33 (2): 473-476; Carr, H. Y.; Purcell, E. M. "Effects of Diffusion on Free Precession in Nuclear Magnetic Resonance Experiments". *Physical Review*, 1954, 94 (3): 630-638; Hahn, E. L. "Spin echoes". *Physical Review*, 1950, 80 (4): 580-594, incorporated herein by reference in entirety). The sequence of vector diagrams illustrating the individual and collective magnetization is provided in FIGS. 4A-4F, representing still images from the animation of a Hahn echo. The red arrows can be thought of as the individual spins. Applying the first pulse rotates the spins by 90 degrees, producing an equal superposition of spin up and spin down (FIG. 2). The spins subsequently "spread out" because each is in a slightly different environment. This spreading out looks like decoherence, but it can be refocused by a second pulse which rotates the spins by 180 degrees. Several simplifications are used in this animation: no decoherence is included, and each spin experiences perfect pulses during which the environment provides no spreading. The individual spins continue focusing after disconnection of RF excitation because the surviving global transverse magnetization persists for several dozen or hundred milliseconds and the lagging individual elements experience the greatest focusing force, being perpendicular to the transverse magnetization vector M.

Both T1 and T2 relaxation mechanisms rely on the mobility of individual nuclei. An acid is a molecule or ion capable of donating a proton (hydrogen ion H+) (a Brønsted-Lowry acid). The protons move by a relay mechanism, with the diffusional leaps facilitated by the energy gain of forming new donor-acceptor bonds in a new location ("anomalous proton diffusion"). The Grotthuss mechanism, along with the relative lightness and small size (ionic radius) of the proton, explains the unusually high diffusion rate of the proton in an electric field, relative to that of other common cations whose movement is due simply to acceleration by the field. Random thermal motion opposes the movement of both protons and other cations. Quantum tunneling becomes more probable with the smaller mass of the cation, and the proton is the lightest possible stable cation Thus there is a minor effect from quantum tunneling also, although it dominates at low temperatures only. The mobilities observed in conductivity are completely applicable to self-diffusion since conductivity in solution represents an electric-field imposed asymmetry in self-diffusion in the up-field and down-field directions (See Cukierman, Samuel "Et to Grotthuss", *Biochimica et Biophysica Acta*, 2006, 1757 (8): 876-8; Agmon, Noam "The Grotthuss mechanism". *Chem. Phys. Lett.* 2005, 244 (5-6): 456-462, incorporated herein by reference in entirety). The hydrogens lacking mobility (in hydrocarbon) are easily differentiated from the acidic hydrogens by a very distinct NMR relaxation pattern.

Figure 5:
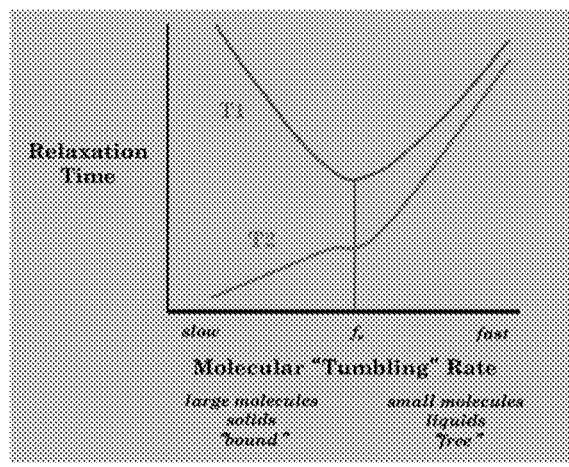
FIG. 5. Dependence of relaxation times T1 and T2 on the chemical nature, free vs. bound status and molecular weight of the molecules in the magnetized environment.

FIG. 5 presents a qualitative diagram and quantitative data comparing T1 and T2 relaxation times in different materials, as a function of the bound vs. free character of the protons and as a function of the molecular masses of each spin-bearing moiety. FIG. 5 illustrates that T1 and T2 are the longest for freely moving molecules of smaller mass, but T1 passes through a minimum and begins to increase again for macromolecules, polymers and nanoparticles. T2 is always shorter than T1 and is especially short for solid-phase or bound species, also demonstrating a much broader dynamic range, thus indicating why T2 is the parameters of choice for assessing the condition of hydrocarbon-bearing formation activated by aqueous acidic emulsion. Both T1 and T2 are shorter for hydrocarbons vs. free water.

Rationalizing of these trends is possible recalling that the detected NMR signal is produced by an ensemble of the flipped spin precessions, rotating in the transverse X0Y plane in the same phase (a necessary simplification). This assembly stores the energy absorbed from the RF pulse in the two major forms: (a) decreased entropy component by maintaining phase coherence and (b) orientation of the magnetic momenta perpendicularly to the acting base field $B_0$. This accumulated excessive potential energy of the ensemble is transferred to the environment, and the efficiency of energy transfer determines the duration of the relaxation period.

The precession movements represent a form of oscillations, and if the elements of the environment also oscillate with the same natural frequency as the precession frequency, the energy transfer becomes very efficient, by the same reason as NMR excitation becoming efficient when the external RF energy has the same period of oscillations. In case of relaxation, it is the oriented molecule in the collective magnetic field that plays the role of the external source and the molecules of the environment may or may not provide resonance absorbance, rapidly depleting the excessive energy of the ensemble. In free water, the own natural frequency ("tumbling rate") exceeds the typical Larmor precession frequencies by orders of magnitude. Thus, the energy transfer is ineffective, and the relaxation times can be 3-5 seconds long for both T1 and T2. Hydrocarbons represent heavier molecules than water with slower "tumbling rate" producing more efficient energy transfer and dissipation for both T1 and T2. Polymers are too slow, and once they acquire transverse magnetization, the passage of energy becomes inefficient due to the "tumbling rate" (own oscillation frequency) of the entire molecules becoming much slower than the precession rate of the nuclei within them. Thus, T1 increases. Due to a very larger number of degrees of freedom, maintaining of precession phase coherence in large molecules requires a very large entropy constraint which is not a probable state. Thus, the magnetizations in these particles decohere rapidly even if the entire molecules do not re-orient rapidly along Z-axis, leading to the shortened T2 at longer T1. In ice, re-orientation of the magnetization vector in parallel to Z axis is hindered by the participation of the water molecules in close order crystal structure, leading to the "tumbling rates" much slower than the nuclear precession frequency and therefore high T1. An ice crystallite can be considered as a polymer-like structure in which maintaining magnetization phase coherence would require large entropy constrain and therefore decohering is energetically favorable, producing short T2 and long T1.

Thus, NMR measurements are sensitive to the mobility of species, to the number of individual species, to the extent of participation in large structures, free or bound character, freely migrating or covalently bound hydrogen status. Sensitivity of NMR to so many parameters (see below) requires development of back-up alternatives. The Measuring While Drilling MWD) alternatives to sample extraction, delivery to a laboratory and application of the results to the process upon completion of the laboratory study are advantageous (See Prammer, M. G., Drack, E., Goodman, G. et al. The Magnetic-Resonance While-Drilling Tool: Theory and Operation. *SPE Res Eval & Eng*, 2001, 4 (4): 270-275. SPE-72495-PA; Appel, M., Radcliffe, N.J., Aadireddy, P. et al. Nuclear Magnetic Resonance While Drilling in the U. K. Southern North Sea. Presented at the *SPE Annual Technical Conference and Exhibition, San Antonio, Tex., USA*, 2002, 29 Sep.-2 Oct. SPE-77395-PA; Morley, J., Heidler, R., Horkowitz, J. et al. Field Testing of a New Nuclear Magnetic Resonance Logging-While-Drilling Tool. *Presented at the SPE Annual Technical Conference and Exhibition, San Antonio, Tex., USA*, 2002, 29 Sep.-2 Oct. SPE-77477-MS; Poitzsch, M., Scheibal, J. R., Hashem, M. et al. Applications of a New Magnetic Resonance Logging-While-Drilling Tool in a Gulf of Mexico Deepwater Development Project. *Presented at the SPWLA 43rd Annual Logging Symposium, Oiso, Japan*, 2002, 2-5 Jun. SPWLA-2002-EEE; Heidler, R., Morriss, C., and Hoshun, R. 2003. Design and Implementation of a New Magnetic Resonance Tool for the While Drilling Environment. *Presented at the SPWLA 44th Annual Logging Symposium, Galveston, Tex., USA*, 2002, 22-25 Jun. SPWLA-2003-BBB; Borghi, M., Porrera, F., Lyne, A. et al. Magnetic Resonance While Drilling Streamlines Reservoir Evaluation. *Presented at the SPWLA 46th Annual Logging Symposium, New Orleans*, 2005, 26-29 Jun. Paper 2005-HHH).

In one embodiment, the method relies on the commercially available drilling assemblies incorporating NMR apparatus among other sensors for providing the real-time multifactorial feedback. The non-limiting examples are Pro-Vision Plus (magnetic resonance while drilling apparatus by Schlumberger). The apparatus and the software acquires the T2 data derived from pore size and fluid properties within several seconds, the T2 data can be further processed to quantify bound- and free-fluid volume and capillary-bound water. MR signal decay data helps ascertain permeability, producible porosity, and irreducible water saturation as well as capillary pressure curves, hydrocarbon identification, and facies analysis. A real-time permeability log enables predicting production rates to optimize completion and stimulation programs.

Analogously, Halliburton Sperry Drilling apparatus and software offers logging-while-drilling (LWD) nuclear magnetic resonance (NMR) source-less porosity solutions to help gain insight into the key petrophysical properties of the reservoir through a mineralogy-independent porosity assessment. The apparatus (MRIL®-WD™ Magnetic Resonance Imaging Logging-While-Drilling Sensor) determine the total porosity of a reservoir, movable fluid volume, capillary bound fluid volume, and micro-porosity—essential information to allow a user to determine which fluids produce hydrocarbons upon stimulation. By calculating a qualitative estimate of permeability, the user identifies which reservoir intervals have greater flow, and can better target the optimal spots for increased production.

Other providers of the small-diameter borehole-adapted NMR apparatuses comprise Mount Sopris Instruments, Baker Hughes Incorporated tools, Dart, Javelin, and Javelin Wireline tools by VISTA-CLARA INC without limitation. These and the additional MRWD (magnetic resonance while drilling) designs are disclosed in U.S. Ser. No. 10/197,698, U.S. Ser. No. 10/401,313, U.S. Ser. No. 10/473,600, U.S. Ser. No. 10/295,627, U.S. Ser. No. 10/338,267, US20190033483, U.S. Ser. No. 10/191,178 incorporated herein by reference in entirety.

In a preferred embodiment, the commercial, experimental and customized downhole NMR apparatuses can support diffusion NMR and can produce the magnetic gradient pulses. Diffusion NMR experiments resolve different compounds spectroscopically in a mixture based on their differing diffusion coefficients, depending on the size and shape of the molecules. Diffusion NMR may be used to resolve otherwise intractable spectra of mixtures, or it may be used to determine the size of molecules and aggregates, determining the degree of polymerization, size of a solvation shell or other microscopic structure. The spectra produced resemble chromatograms is some respects while also providing NMR information that can be used for the assignment of individual components.

Figure 6A:
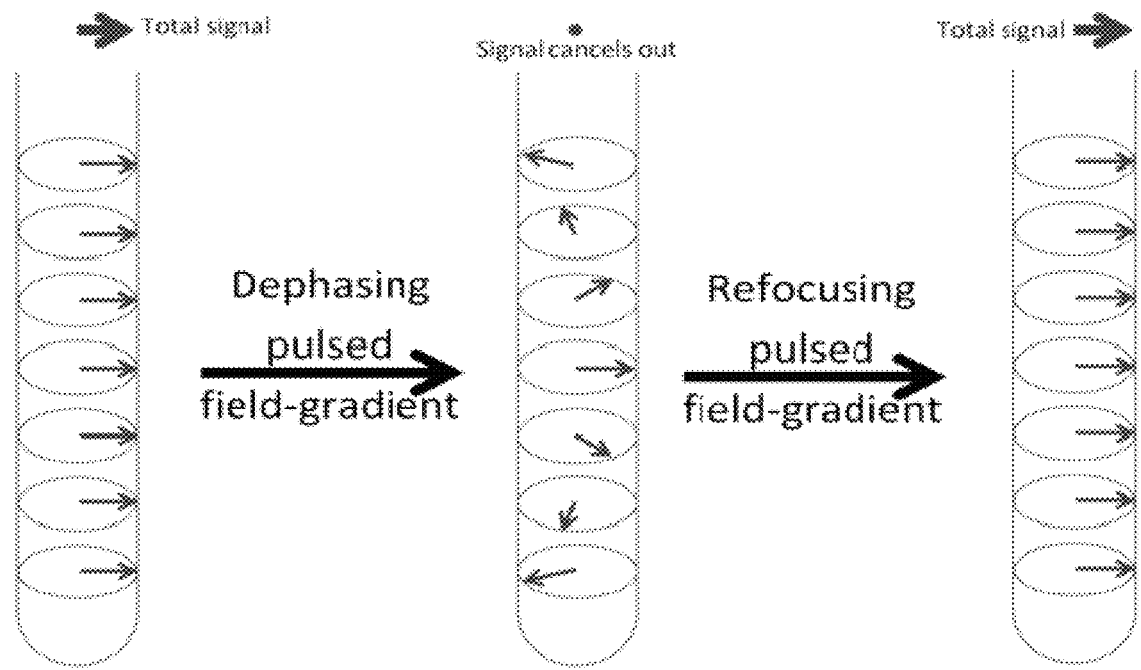
FIG. 6A: General scheme of PGSE (pulse field gradient echo) for measuring molecular diffusion.
Figure 6B:
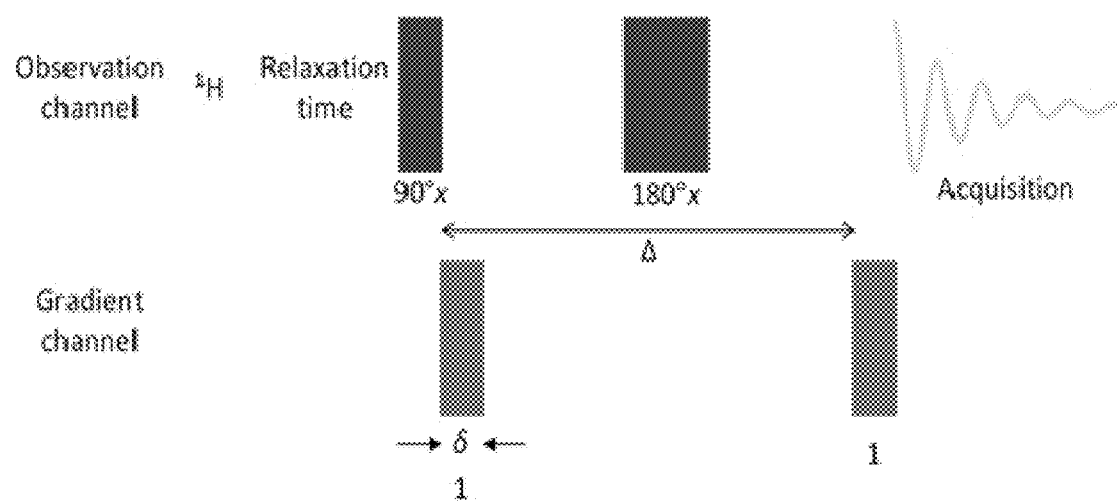
FIG. 6B: The relation of RF and magnetic gradient pulses in the diffusional measurements.
Figure 6C:
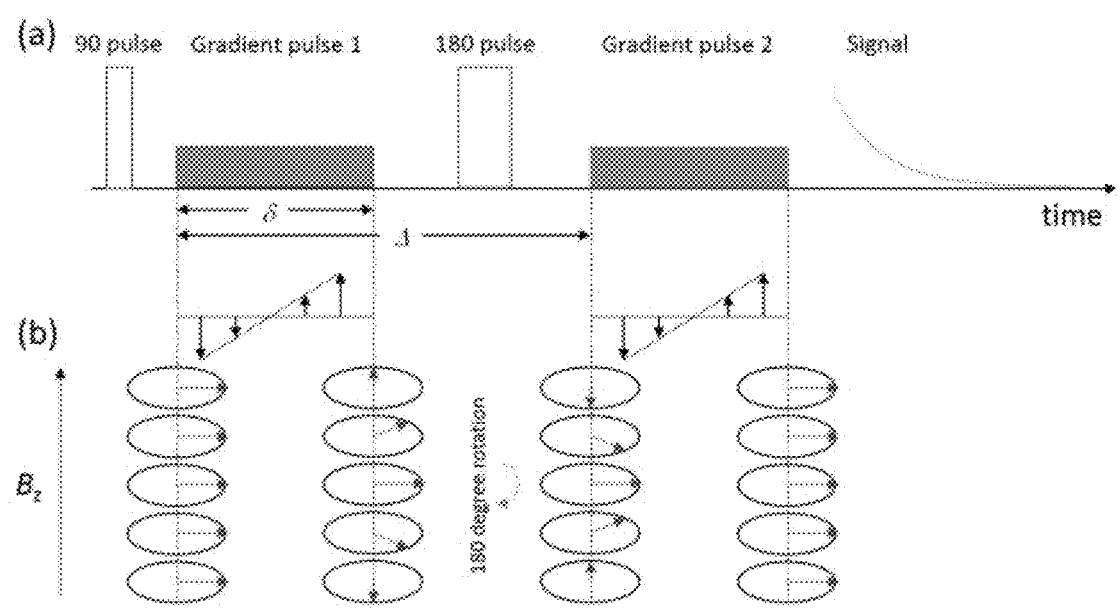
FIG. 6C: Development of decoherence and the subsequent re-focusing in the nuclei assembly as a function of RF pulses (hollow rectangular vertical bars) and magnetic gradient pulses (blue rectangular horizontal bars).

FIGS. 6A-D illustrate the principles of diffusion NMR with a magnetic pulse gradient. As shown in FIG. 6A, the magnetization vector is already 90 degrees "flipped" by the RF pulse, producing a detectable signal in the transverse detector coil. The precession movement of the nuclei is synchronized in the resonance transition. The term "dephasing pulse-field gradient" refers to the gradient of the magnetic field generated by the gradient magnetic coils (FIG. 1), to be differentiated from the RF pulse generated by RF coils. Imposition of different B values in the analyzed volume by the magnetic gradient pulse leads to different precession frequencies and therefore decoheres the initial magnetized environment post 90 degree "flip". No signal can be detected, since the global magnetization vector becomes zero. "Refocusing pulse field gradient" re-orients the nuclei that were in phase after the 90 degree "flip" and restores the signal in the detector, however, the diffusion of the species out of the volume that communicates with the detector coil diminishes the restored signal. Thus, the difference between signals before and after the sequence cycle provides the basis for estimating the diffusion coefficients. FIG. 6B illustrates the refocusing aspect. After a period of Δ/2 a 180° radiofrequency pulse inverts the dispersed magnetization such that after a period of A the magnetization is the negative of what it was following the gradient pulse. At this point, a second gradient pulse is applied to refocus the signal. The refocusing develops due to two contributions: one is the 180 degree "flip" counted vs. the initial 90 degree "flip" as typical in echo sequences and accomplished by an RF pulse (blue upper signals in FIG. 6B). The magnetization focusing by this mechanism was disclosed above. The second mechanism is the reversal of the magnetic pulse (the second pulse of the magnetic gradient), shown in red in FIG. 6B. The phase diagram in FIG. 6C illustrates the interaction between the 180-degree RF pulse and the second magnetic gradient pulse. The FIG. 6C clarifies that the individual magnetic momenta of the nuclei that lag behind the neighbors or overtake them in terms of precession movement return to the previous position after the 180 degree RF and the second magnetic gradient pulse (inverted vs. the first gradient pulse), restoring the coherence and allowing to observe the signal. The PGSE sequence leads to identification and diffusion coefficient measurement for the diverse species, including acidic protons, including, without limiting 2H and 3H substitutions (see below).

In PGSE in the case of self-diffusion of molecules, the normalized signal amplitude E/E0 decays as a Gaussian curve with increasing magnetic gradient pulse amplitude G:

$$\frac{S(TE)}{S_0} = \exp\left[-\gamma^2 G^2 \delta^2 \left(\Delta - \frac{\delta}{3}\right)D\right] \quad (13)$$

where $S_0$ is the signal intensity without the diffusion weighting, S (TE) is the signal with the magnetic field gradient, $\gamma$ is the gyromagnetic ratio, G is the strength of the gradient pulse, $\delta$ is the duration of the pulse, $\Delta$ is the time between the two pulses, and finally, D is the diffusion coefficient.

Figure 6D:
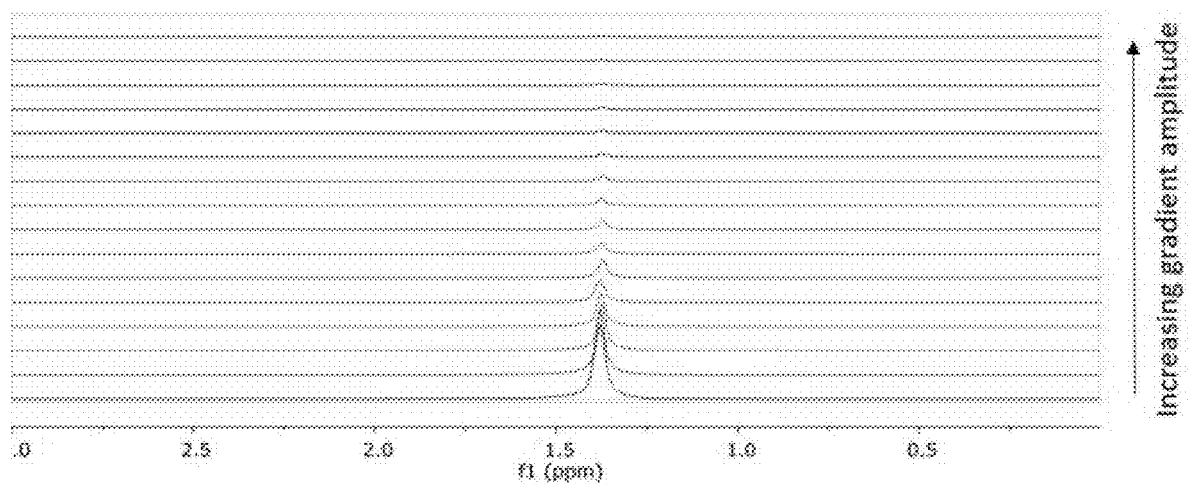
FIG. 6D: Accumulation of data points in the diffusion measurements by NMR.

FIG. 6D shows the stacked experiment, where the strength of the residual signal S(TE) is plotted as a function of the magnetic field gradient G. The FIG. 6D illustrates how the resonance signal emerges at the resonance RF frequency f1 and how the signal decreases in the serial measurements as a function of dephasing magnetic gradient pulse.

In a preferred embodiment, the apparatus and software support partial flip angles with more rapid accumulation of multiple data points to produce logarithmic plots based on (13). The plots are linear in the coordinates [ln S(TE)/S0=k $G^2$] where the coefficient k includes the diffusion coefficient and the cycle pulse parameters. The rate of data point accumulation is important to increase the signal-to-noise ratio, which may be high in the NMR method of diffusion measurement due to high propagated error. In this embodiment, the partial flip angles range from 10 to 85 degrees without reaching the 90 degrees, which is achievable by softer RF pulses. The increased rate of data acquisition is achievable under these conditions due to shorter periods of magnetization energy accumulation and relaxation. In addition, partial flip angles alleviate the limitations on sensitivity that arise from the quantum-mechanical nature of the phenomenon. For quantum states separated by energy equivalent to radio frequencies, thermal energy from the environment causes the populations of the states to be close to equal. Since incoming radiation is equally likely to cause stimulated emission (a transition from the upper to the lower state) as absorption, the NMR effect depends on an excess of nuclei in the lower states. Several factors can reduce sensitivity, including increasing temperature, which evens out the population of states.

Conversely, low-temperature NMR can sometimes yield better results than room-temperature NMR, providing the sample remains liquid. Saturation of the sample with energy applied at the resonant radiofrequency (complete flip angles, 90 degrees or above) is another sensitivity-reducing factor. This manifests in both constant wave (CW) and pulsed NMR. In the first case (CW) this happens by using too much continuous power that keeps the upper spin levels completely populated. In the second case (pulsed), each pulse (that is at least a 90° pulse) leaves the sample saturated, and four to five times the (longitudinal) relaxation time (5T1) must pass before the next pulse or pulse sequence can be applied. For single pulse experiments, shorter RF pulses that tip the magnetization by less than 90° can be used, which loses some intensity of the signal, but allows for shorter recycle delays. The optimum "flip" angle is called an Ernst angle. The relaxation times for the protons in free water are relatively short, but in the drilling conditions, nanoparticles and hydrocarbon-based aggregates contribute slowly relaxing components, and the use of partial angles can be advantageous.

Figure 7:
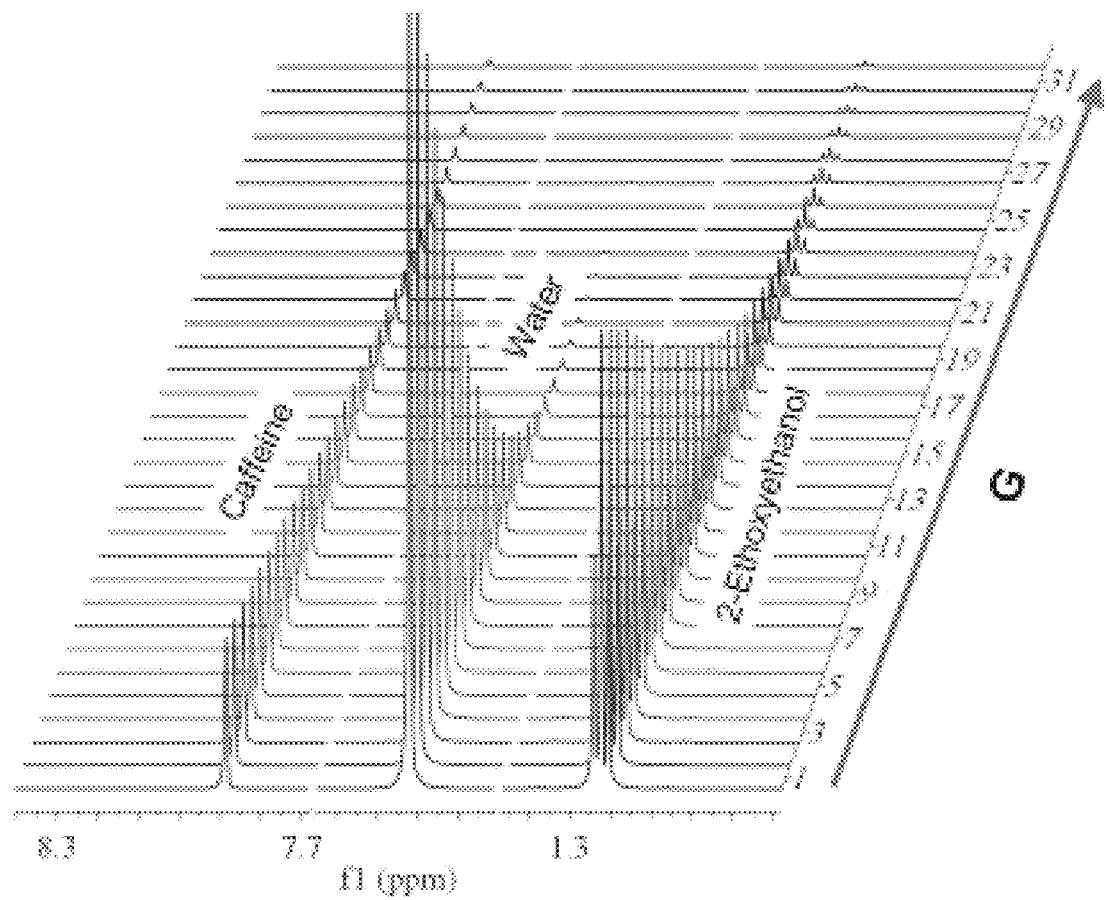
FIG. 7: Diffusion ordering spectroscopy NMR (general scheme).
Figure 8:
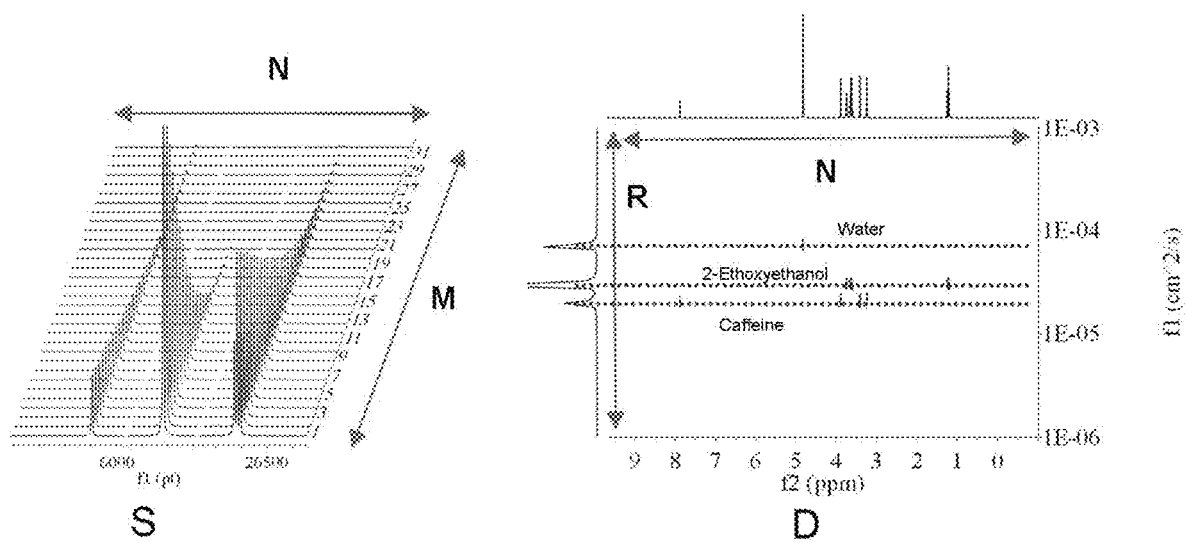
FIG. 8: Transformation of the f1-G data into DOSY data.

In another preferred embodiment, multiple diffusion coefficients are simultaneously measured in combination by pulsed NMR, with the device and software supportive of data generation and analysis. FIG. 7 presents Diffusion-Ordering Spectroscopy NMR (DOSY). The figure presents a 2D plot with the abscissa being the chemical shifts and the ordinate being the magnitude of the magnetic gradient (See equation 13). The chemical species are identified by the shifts, and the decay of the signal is a function of magnetic gradient pulse strength G is plotted for each chemical shift. As far as data processing of raw PFG-NMR spectra is concerned, the goal is to transform the N×M data matrix S into an N×R matrix (2D DOSY spectrum) as shown in FIG. 8. The horizontal axis of the DOSY map D is identical to that of S and encodes the chemical shift of the nucleus observed (generally 1H). The vertical dimension, however, encodes the diffusion coefficient D. In the ideal case of non-overlapping component lines and no chemical exchange, the 2D peaks align themselves along horizontal lines, each corresponding to one sample component (molecule). The horizontal cut along such a line should show that the component's 'normal' spectrum of chemical shifts. Vertical cuts show the diffusion peaks at positions defining the corresponding diffusion constants. The mapping S=>D is called the DOSY transformation. This transformation is, unfortunately, far from straightforward. Practical implementations of the procedure include mono and biexponential fitting, Maximum Entropy, and multivariate methods such as DECRA 'Speedy Component Resolution' (See M. Nilsson and Gareth A. Morris in *Anal. Chem.*, 2008, 80, 3777-3782 incorporated herein by reference in entirety) as an improved variation of the Component Resolved (CORE) method (*J. Phys. Chem*, 1996, 100, 8180, incorporated herein by reference) providing a multivariate-based that shows an advantageous performance of the algorithm.

Figure 9:
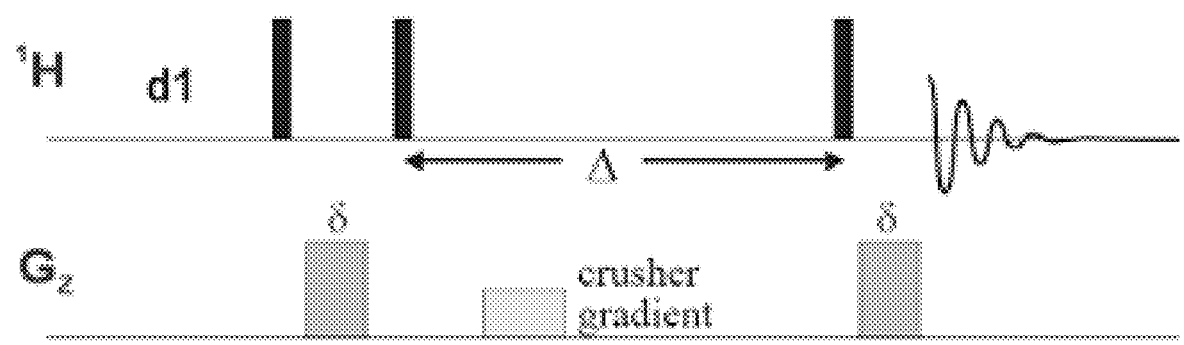
FIG. 9: A scheme of stimulated echo sequence (STE) NMR experiment.
Figure 10:
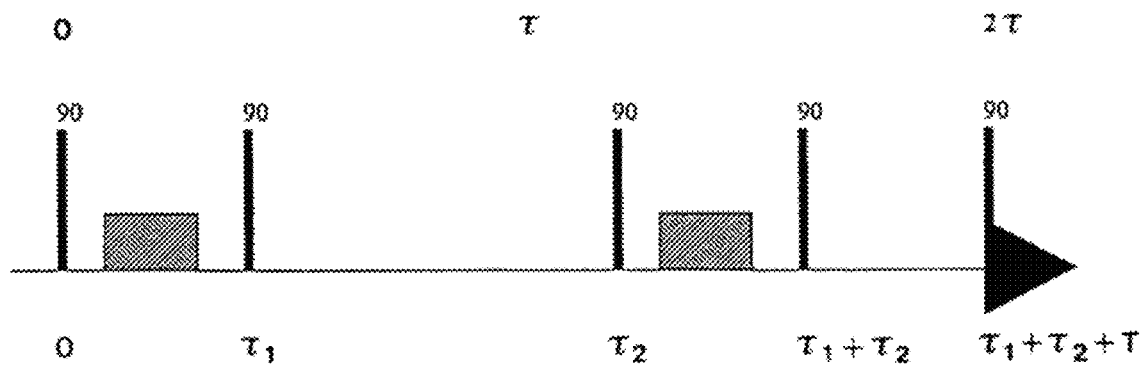
FIG. 10: A scheme of longitudinal encode-decode or "longitudinal eddy current delay" echo sequence NMR experiment.
Figure 11:
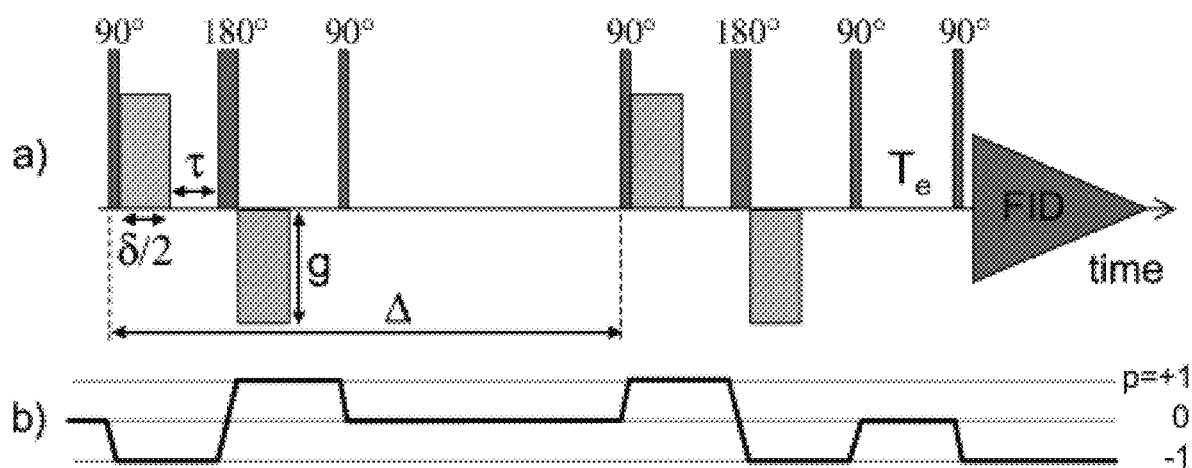
FIG. 11: Bipolar gradient longitudinal encode-decode BPP-LED pulse sequence NMR experiment.
Figure 12:
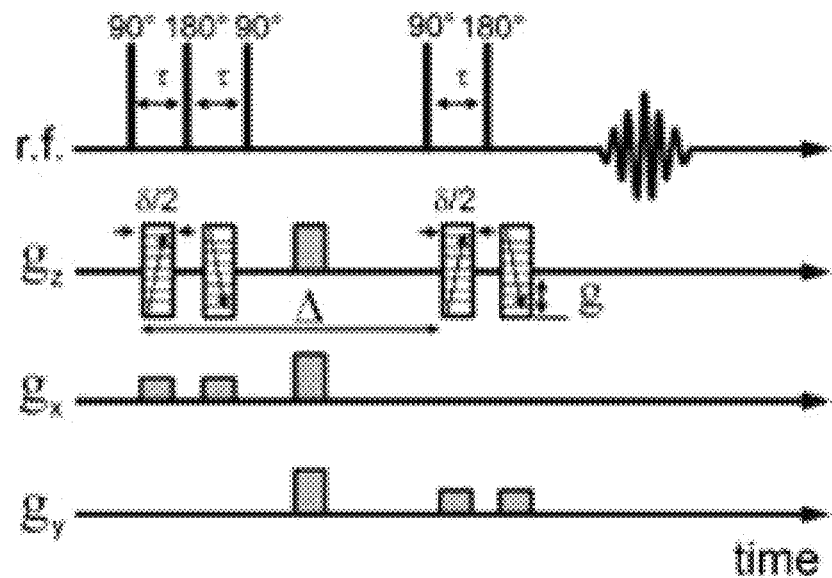
FIG. 12: Alternating Pulsed Field Gradient Stimulated Echo Nuclear Magnetic Resonance (APGSTE) sequence.

In another preferred embodiment, the apparatus and software support the additional sequences suitable for the diffusion coefficient measurements: the Hahn stimulated echo (STE) with pulsed field gradients (FIG. 9). The sequence is analogous to PGSE but differs by providing two 90 degrees RF pulses in place of one 180-degree RF pulse in PGSE and by insertion of an additional "crusher" magnetic gradient pulse step. The LED (longitudinal encode decode) pulse sequence used in the NMR diffusion experiments is shown in FIG. 10. The radiofrequency pulses are shown as filled vertical rectangles with the flip angles denoted above each pulse. The magnetic field gradient pulses are shown as hatched rectangles, and the data acquisition is indicated with a vertically hatched triangle. Bipolar gradient longitudinal encode-decode pulse sequence (BPP-LED) is shown in FIG. 11. The BPPLED method cancels the adverse effects of eddy currents using two gradient pulses with identical areas but different polarities. Other embodiments comprise, respectively, the gradient compensated stimulated spin-echo pulse sequences (GCSTE), the double stimulated echo sequence (DSTE), the STE-INEPT pulse sequences for heteronuclear detected DOSY with coherence transfer, shuttle based fringe field 2D-DOSY, and the Alternating Pulsed Field Gradient Stimulated Echo Nuclear Magnetic Resonance (APGSTE) sequence (FIG. 12) without limiting. The APGSTE sequence is especially preferred for analyzing anisotropic diffusional systems, such as hydrocarbon-bearing formations with anisotropic porosity and tortuosity distributions. The sequence comprises focusing and de-coherence by the series of magnetic gradient pulses in 3 dimensions, explaining its unique suitability for more realistic modelling of diffusional coefficient tensors. All sequences lead to processing and data collection/transform by the DOSY methodology, with the Tanner and Stejskal equation modified for each specific sequence (See Jan Hrabe, Gurjinder Kaur, and David N. Guilfoyle, "Principles and limitations of NMR diffusion measurements" in *J Med Phys.*, 2007 January-March; 32(1): 34-42; Davy Sinnaeve, "The Stejskal-Tanner Equation Generalized for Any Gradient Shape—An Overview of Most Pulse Sequences Measuring Free Diffusion" in *Concepts in Magnetic Resonance Part A*, 2012, Vol. 40A(2) 39-65, incorporated herein by reference in entirety).

In the most preferred embodiments, the inherent pitfalls of the DTI (diffusion tensor imaging) methodology are addressed. Diffusion measurement pitfalls include, without limiting:

(a) Subject Motion or Convection Pitfall in the Drilling/Fracturing Context

Because diffusion sequences are so sensitive to even minute movement of spins, macroscopic (convective) sample motion is the biggest obstacle in diffusion experiments, especially when the motion has variable velocities in the form of linear acceleration or rotation. Especially distorting is downhole vortex formation upon intense injection and pumping of all fluids. The need to inject the formation at high velocity for the optimal performance accentuates this drawback even more.

(b) Imaging Gradients

Although the diffusion gradient pair has a dominant effect on the randomly walking spins, any other gradient present during the experiment also acts upon the magnetization phase and thus alters the diffusion signal. Besides the diffusion gradients, a typical MM pulse sequence has a considerable number of other gradients used for slice selection, phase encoding, and readout. They can all imitate the additional and unwanted diffusion gradients. This is important whenever a precise quantitative diffusion measurement is to be undertaken.

(c) Local Gradients

Local magnetic field gradients due to inhomogeneities of magnetic susceptibility not only enhance the decay but also act as small spatially variable diffusion gradients. Unlike the pulse sequence gradients, the local gradients are usually not known in any detail, and their precise effect, therefore cannot be calculated. However, spin echo sequences decrease this type of diffusion weighting.

(d) Dependence on the Diffusion Time

The result of a diffusion experiment very much depends on the diffusion time $\tau$, encoded in the sequence characteristics. For example, if the diffusion time was extremely short, most molecules would not collide with any obstacles (pore walls), and the process would closely approximate free diffusion. Longer diffusion time gives the molecules more opportunity to explore the complex formation environment and sample its geometric tortuosity, as well as to move between the intra-pore and extra-pore compartments. Dependency on the diffusion time means that one cannot reasonably mix results obtained with different diffusion times. This also implies that the diffusion time should always be reported because data interpretation is not possible without it. Unfortunately, limited maximum gradient strength and the need to avoid eddy currents often result in relatively long diffusion gradients distributed throughout the sequence. It is impossible to define the diffusion time of such sequences. Depending on the exact sequence design, such experiments can become essentially qualitative in nature and difficult to compare with those obtained by another sequence. The results acquired with such sequences would be truly quantitative only if the diffusion was strictly Gaussian, that is if the diffusion constant (or tensor) did not depend on the diffusion time for the whole range of the diffusion times involved (e.g., in an agar gel phantom).

(e) Porosity Compartments

The most common molecule used in NMR diffusion measurements is, by a large margin, water. Because water is ubiquitous in drilling fluids, the detected signal typically comprises a mixture of components from the extra-pore and intra-pore compartments, generally of different diffusion properties. The situation is considerably complicated by the exchange of water between these compartments. The intrapore space may be compartmentalized even further due to hydrocarbon inhomogeneities.

(f) Inhomogeneous Voxels

The voxel size in most diffusion imaging experiments is quite large. However, the Stejskal-Tanner formula assumes constant D in the entire measured region. If the voxel contains anisotropic material, the assumption of homogeneity is violated. The diffusion signal becomes a mixture of two or more compartments, and the result depends both on their individual properties and the rates of exchange between them. The degree to which diffusion is non-Gaussian can be quantified with diffusional kurtosis imaging. For example, if the voxel environment comprises separate compartments, each with its own Gaussian diffusion, kurtosis imaging can establish the degree of diffusion coefficient variability inside this voxel.

(g) Apportioning the DTI Imaging Time

Many formation regions are significantly anisotropic. The Stejskal-Tanner formulae can still be used in this case, but the experiment has to be repeated with different gradient directions (hence, the APGSTE approach). Larger anisotropy may require more sampling directions and use of Ernst angle parameters. In general, given a finite available imaging time, the tradeoff is made by spending it on more signal averages, more gradient directions, or more different diffusion times.

(h) Temperature and Viscosity

Diffusion depends not only on the size of the diffusing molecule (its Stokes hydrodynamic radius) and on geometric tortuosity of the environment but also on temperature and viscosity. Viscosity in turn also depends on temperature and pore size. The overall effect is a faster diffusion at higher temperatures.

(i) Larger Molecules

It is perfectly feasible to measure the diffusion of the other substances than water. Standard MR spectroscopic techniques can be used, with the addition of diffusion gradients. The attenuation of signal peaks corresponding to the emulsion nanodrops still obeys the Stejskal-Tanner formulae. However, smaller gyromagnetic ratios of these heterogeneities (also consider solvation water on polar emulsified hydrocarbons) are reflected in smaller Larmor frequencies. The only remedy is to use a larger diffusion gradients—and hence to account for greater eddy currents.

(j) Scanner Hardware

Diffusion sequences are very demanding on the scanner. The gradient set is required to perform very accurately and achieve perfect symmetry of the diffusion gradient pairs. Equally important is their spatial linearity. Because resolution depends on a square of the gradient, a nonlinearity of 5% over the subject region translates into 10% error in the diffusion coefficient. Suppression of eddy currents is also essential. They produce observable artefacts, complicating the diffusion experiment. Careful pulse sequence design and various post-processing corrections are advantageous, but the most important factor is the quality of the scanner hardware and its maintenance—a challenge since the competing requirement is minimization of the downhole apparatus dimensions. Good performance on standard sequences does not guarantee that the same system can be successfully used for diffusion experiments in varied conditions.

(k) The Role of Acidity Consumption by Carbonates:

Reactivity in-situ may alter the diffusion coefficient values according to the APGSTE sequence methodology. Ideally, the monitored nuclei should depart the observation region by diffusion only. However, the role of convection (disclosed above) is further compounded by chemical reaction converting acidic protons into water protons with much lower self-diffusion coefficients and thus compounding the effects of convection in the downhole. Moreover, the rate of this neutralization reaction is variable as a function of carbonate exposure, being higher in the bare carbonate pores and lower where the pores are protected by the exiting hydrocarbons in the stimulated rock.

Figure 13:
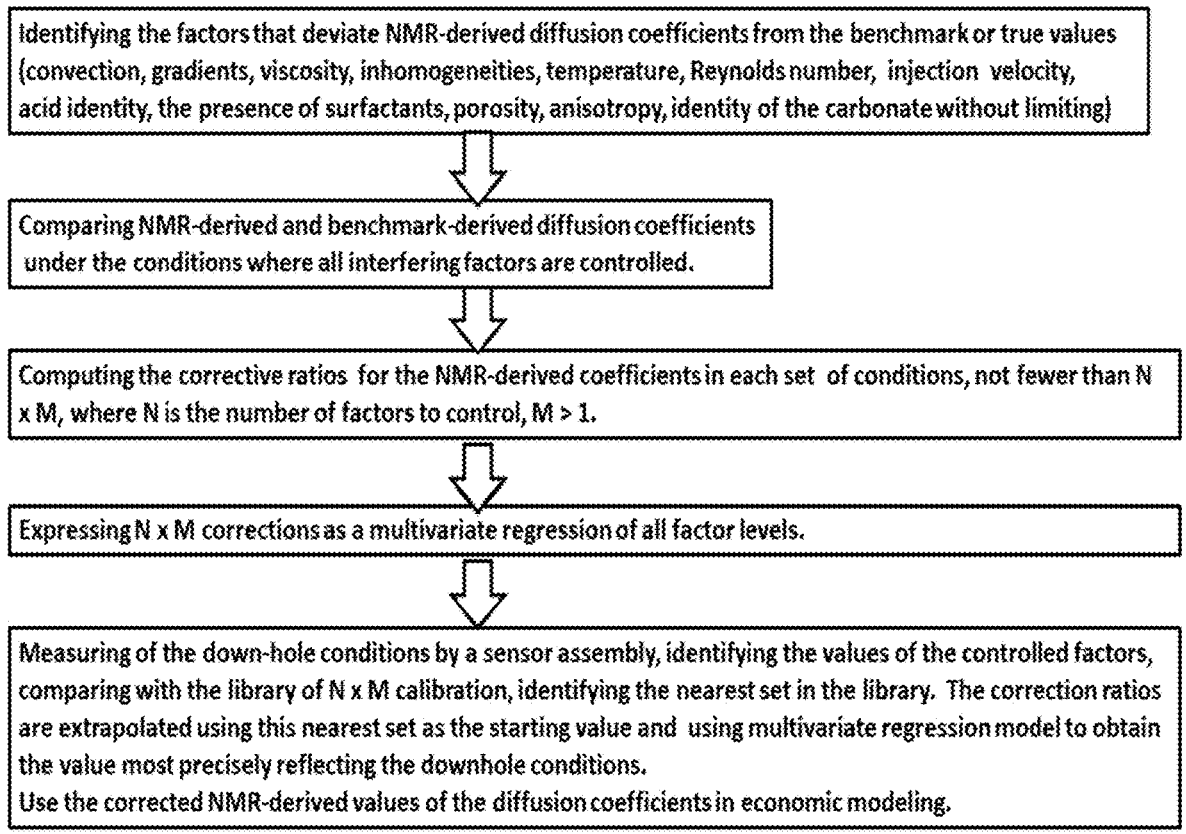
FIG. 13: Flow-chart of the corrective method for NMR-derived diffusion coefficient adjustment.

The most preferred embodiment bypasses the challenges as outlined above by incorporating the APGASTE sequence and adjusting the fitted diffusion constants produced by the Tanner and Stejskal equation fit specific for APGASTE with the empirical corrections. FIG. 13 presents the flow-chart of the corrective method, presented below. The corrections are produced by extensive training of the device and software in the laboratory conditions comprising series of the situations resembling the downhole situations, identifying the "true" diffusion coefficients by non-NMR methods and adjusting the NMR-based acidic diffusion coefficients under the decision tree criteria.

The criteria include the chemical composition of rock formation, porosity, anisotropy, hydrocarbon wetting, acid concentration, acid composition, asphaltene content in oil, Reynolds number for the acidic emulsion, injection rate, the observed hydrocarbon productivity and the ratio of the productivity to the acidulating emulsion, temperature, viscosity. These 12 parameters are varied at two levels each and the trends are assumed to extrapolate linearly. Not less than 12 laboratory experiments, but preferably >48 are conducted to ensure the adequate fit of the laboratory parameters above and the empirical corrections to the NMR-derived diffusion coefficients. A multivariate regression is defined:

$$D_{exp}/D_{nmr} = b_0 + \Sigma b_i \times f_i \quad (14)$$

Where $D_{exp}/D_{nmr}$—is the ratio of experimental diffusion coefficient determined in the given set of conditions to the NMR-based diffusion coefficients, the set of $b_0$-$b_{12}$ are the regression coefficients, the factors $f_1$-$f_{12}$ describe the factors determining the magnitude of the empirical correction. The equations (14) are written for each set of conditions, the said number of conditions to exceed the number of regression coefficients b to the point of a satisfactory statistical resolution, with the number >12 and without theoretical limitation on the upper side.

To define the system of corrective equations (14), and to accumulate the factor values, the downhole assembly is equipped with multiple non-NMR probes. Non-limiting examples of integrated drilling sensor assemblies are U.S. Pat. No. 6,206,108, U.S. Ser. No. 10/353,032, U.S. Pat. No. 9,879,519, U.S. Ser. No. 10/167,718, incorporated herein by reference in entirety. The chemical nature of the rock formation, the extent of hydrocarbon exudation and its asphaltene content can be assessed and mapped by sampling of the downhole debris washed out with the drilling fluid at different depths. The list of exemplary rocks comprises without limiting sandstones, carbonates, Calcite, Aragonite, Chalk, Limestone, Dolomite, Gaspeite (Nickel Magnesium Iron Carbonate), Magnesite (Magnesium Carbonate), Otavite (Cadmium Carbonate), Rhodochrosite (Manganese Carbonate), Siderite (Iron Carbonate), Smithsonite (Zinc Carbonate), Sphaerocobaltite (Cobalt Carbonate), Hydromagnesite (Mg5(CO3)4(OH)2.4H2O), Ikaite (CaCO3.6 (H2O), Lansfordite MgCO3.5(H2O), Monohydrocalcite CaCO3.H2O. Most preferably, the carbonates of calcium, magnesium, barium and iron are the subject of acidic stimulation, especially the porous carbonates of calcium and magnesium.

In the process of downhole movement, the sensor assembly comprising the NMR unit measures the vector of conditions as per equation (14) and aligns it with the library of the tested conditions available either individually or utilizing the collective data through the online cloud computing. The algorithm of comparison relies on distance clustering as the criterion of proximity (a less preferred alternative is Pearson's correlation of the profiles or K-means clustering). The clustering results and the individual values inform the decision tree algorithm assigning the downhole condition to one set of laboratory values and the corresponding correction value. The diffusion coefficient correction at this point is further modified by extrapolation by the model (14) to the real downhole conditions. The procedure leads to an estimate for the most probable empirical correction to the NMR-based diffusion coefficient.

In the most preferred embodiment, such corrective calibration method for measuring the real diffusion coefficient is that of a rotating disk. The algorithm deconvolutes the porosity and acidity effects, as well as of the hydrocarbon and emulsifier presence. The algorithm is trained to deconvolute these factors correctly by analyzing the dozens of porous rock species mixed with a moderated acidulant.

Non-limiting examples of such moderated acidulants are represented by the publications (see Sanchez Bernal M, Tate J, Idris M, Soriano J E, Lopez A E, Fatkhutdinov D. in Acid Fracturing Tight Gas Carbonates Reservoirs Using CO 2 to Assist Stimulation Fluids: An Alternative to Less Water Consumption while Maintaining Productivity. *In SPE Middle East Unconventional Resources Conference and Exhibition* 2015 Jan. 26. Society of Petroleum Engineers; U.S. Ser. No. 10/329,477, US20130233559), incorporated herein by reference in entirety. Other non-limiting examples of acidulants comprise HCl, HF, formic, acetic, citric, chelating agents such as EDTA, GLDA, HEDTA, DTPA, NTA, MGDA without limiting.

A rotating disk of a porous carbonate material saturated with a hydrocarbon with variable asphaltene content (previously conducted at elevated temperature and high pressure) is exposed to a modeled acidifying composition. The rate of dissolution of the disk depends on the rate of reaction per se and the rate of acid diffusion, acting as resistance in serial in term of total reaction kinetics. Rotating Disc Acid Reaction Systems are exemplified, without limiting by the product of Core Laboratories. Rotating Disc Acid Reaction System, CRS-100, is a computer-controlled acid reaction system that allows for the controlled reaction of reservoir rock samples with acidification fluids and the timed sequential collection of reactant fluid. From the chemical analysis of the reactant and the experimental and sample collection data from the CRS-100 the reaction rates of carbonate and dolomite samples can be calculated and the results used in the design of effective acid stimulation treatments of wells. The CRS-100 features a 3,000 psig (21 MPa) pressure vessel as standard with a 1 in. rotating disc, magnetic drive system, temperature control system, fraction collector and data acquisition and control software. Pressure, temperature, acid displacement and test duration are software controlled. The software permits the collection of reactant samples at preselected time intervals. The CRS-100 has been specifically designed to measure rock/acid reaction rates using common oil industry acids (Hydrochloric, Hydrofluoric, Acetic etc.) at pressures of 3,000 psig standard and 5,000 psig and 7,240 psig as options and temperatures up to 250° C. Also see Levich, V. G., in *Physicochemical hydrodynamics*. Englewood Cliffs, N.J.: Prentice-Hall, 1962; Lund, K., Fogler, H. S., McCune, C. C., Acidization—I. The dissolution of dolomite in hydrochloric acid. *Chem. Eng. Sci.* 1973, v. 28, 691-700; Newman, J., Schmidt Number Correction for the Rotating Disk. *J Phys. Chem.* 1966, v. 70, 1327-1328; Mahmoud, M. A. and Nasr-El-Din, H. A. Modelling Flow of Chelating Agents During Stimulation of Carbonate Reservoirs. *Arab J Sci Eng* (2014) 39: 9239, incorporated herein by reference in entirety. Incorporation of a rotating disk apparatus in a borehole sensor assembly is problematic from an engineering perspective and these measurements are conducted off-site. However, combining the library of such calibrating off-site measurement results aligned with more available sensor information from the downhole assembly, including NMR data is advantageous.

Figure 14A:
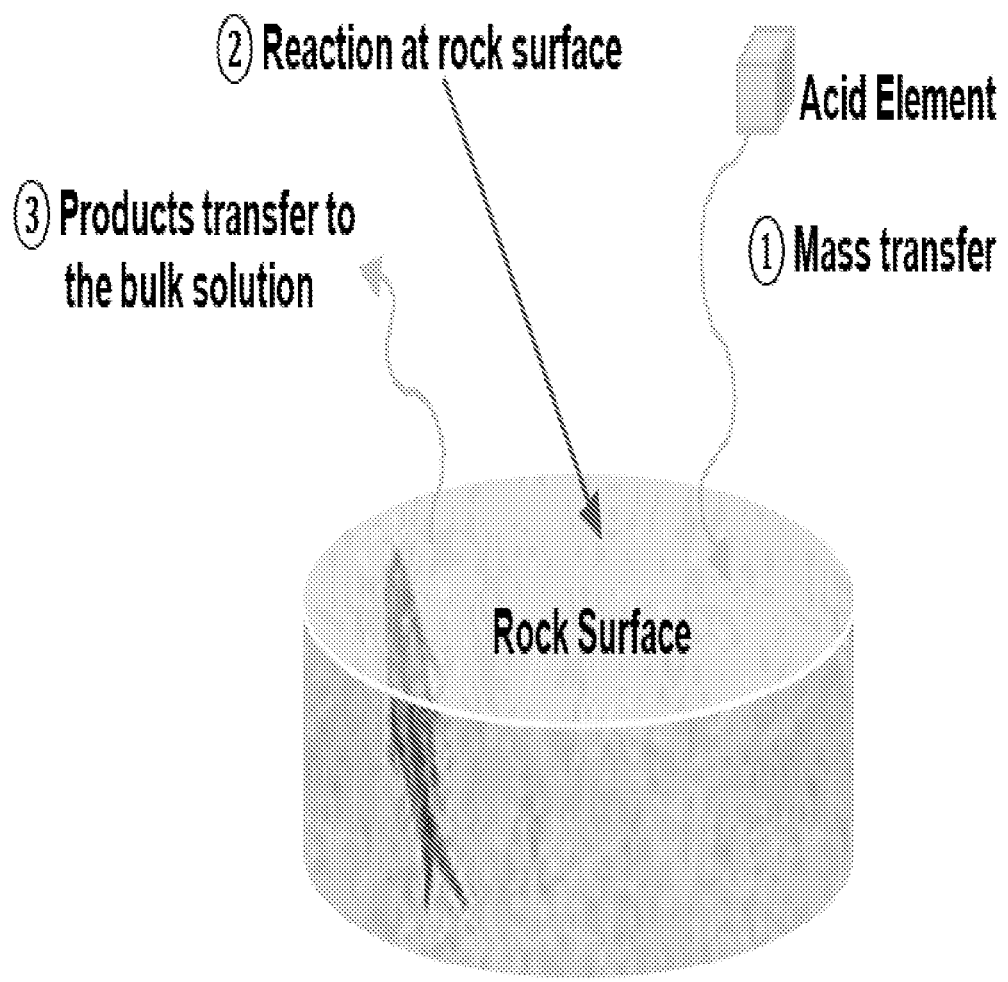
FIG. 14A: The scheme of diffusion coefficient measurement by the rotating disk method.
Figure 14B:
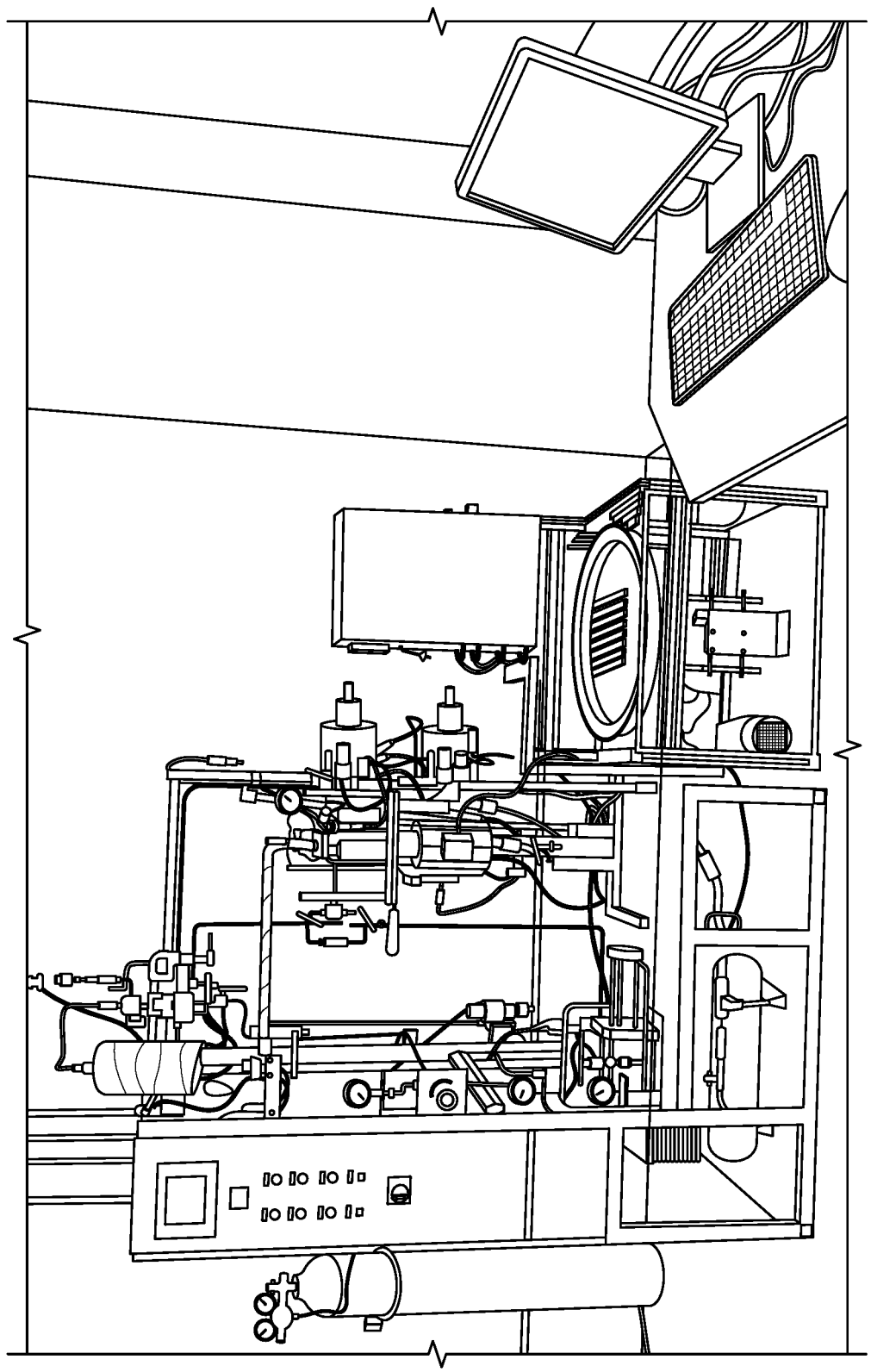
FIG. 14B: The apparatus for diffusion coefficient measurement by the rotating disk method.

FIG. 14A presents the general scheme of a rotating disk measurement and FIG. 14B visualizes a typical laboratory installation.

The following equations to determine the fluid diffusion coefficient using a rotating disk apparatus:

$$R_{MT} = \frac{J}{A} = K_m(C_b - C_s) \tag{15}$$

$$K_m = \frac{0.60248\left(S_c^{-\frac{2}{3}}\right)\sqrt{v\omega}}{1 + 0.2980\left(S_c^{-\frac{1}{3}}\right) + 0.1451\left(S_c^{-\frac{2}{3}}\right)} \tag{16}$$

Where:
J Mass transfer flux
A Surface area, cm$^2$
$C_b$ Bulk concentration
$C_s$ Surface concentration
$K_m$ Mass transfer coefficient
ω Rotational speed of the disk, s$^{-1}$
ρ Density of the fluid, gm/cm$^3$
μ Fluid viscosity, gm/s·cm
v Kinematic viscosity (μ/ρ), cm$^2$/s
Sc Schmidt number ((v/D$_e$), dimensionless)
D$_e$ Diffusion coefficient cm$^2$/s For a mass transfer limited regime, and due to the negligible concentration of reactants at the reaction solid surface then Cs is ~0). The final form of the mass transfer rate for a laminar flow of a Newtonian fluid can be expressed as follows:

$$R_{MT} = K_m(C_b) = \frac{0.60248\left(S_c^{-\frac{2}{3}}\right)\sqrt{v\omega}}{1 + 0.2980\left(S_c^{-\frac{1}{3}}\right) + 0.1451\left(S_c^{-\frac{2}{3}}\right)} C_b \tag{17}$$

$$R_{MT} = \frac{0.60248\left(S_c^{-\frac{2}{3}}\right)C_b\sqrt{v}}{1 + 0.2980\left(S_c^{-\frac{1}{3}}\right) + 0.1451\left(S_c^{-\frac{2}{3}}\right)} \omega^{\frac{1}{2}} \tag{18}$$

$$R_{MT} = \frac{0.60248\left(\frac{\mu}{\rho D_e}\right)^{-\frac{2}{3}} C_b \sqrt{\frac{\mu}{\rho}}}{1 + 0.2980\left(\frac{\mu}{\rho D_e}\right)^{-\frac{1}{3}} + 0.1451\left(\frac{\mu}{\rho D_e}\right)^{-\frac{2}{3}}} \omega^{\frac{1}{2}} \tag{19}$$

The surface reaction rate as a function of concentration is described by the following power-law model:

$$-r_{HCl} = kC_s^n = J_{mt} \tag{20}$$

Where:
$r_{HCl}$ Dissolution rate of dolomite rock or calcite rock in HCl (moles/s·cm$^2$)
k Specific reaction rate (moles/cm$^2$·s)(mole/cm$^3$)$^{-n}$
$C_s$ Surface concentrations of the transferring species
n Dimensionless reaction order The rock dissolution can be determined by knowing the surface area of the reacting disk. The dissolution rate is calculated by dividing the slope of the straight line fitted to each experiment results by the initial surface area of the disk (see Lund, K., Fogler, H. S., McCune, C. C., Acidization—I. The dissolution of dolomite in hydrochloric acid. *Chem. Eng. Sci.* 1973, v. 28, 691-700, incorporated herein by reference in entirety).

$$R = \frac{1}{A_0} \frac{d(Ca)}{dt} \tag{21}$$

Where
R Dissolution rate of calcite in acid (mole/s·cm$^2$)
t Time (sec)
$A_o$ Initial surface area Initial surface area $A_0$ can be determined using the disk porosity (ϕ) and core surface area ($A_c$).

$$A_0 = (1-\phi)A_c \tag{22}$$

Figure 15:
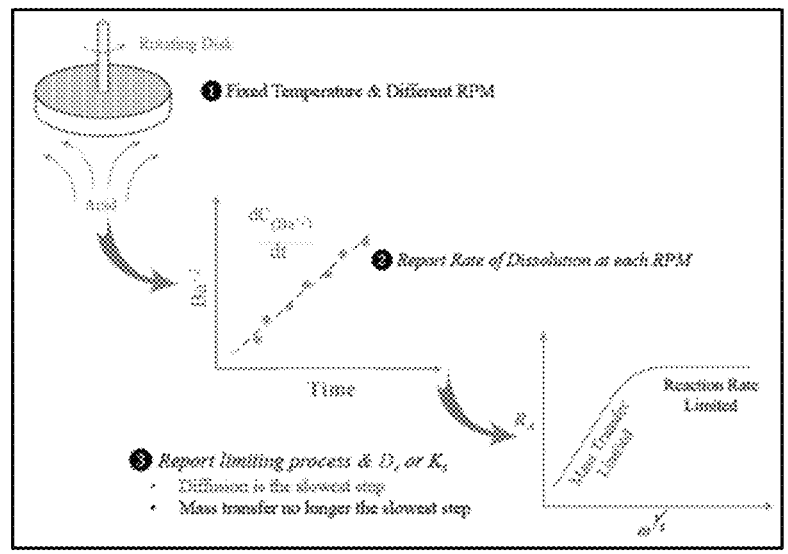
FIG. 15: The procedure for determining the reaction limiting step in the rotating disk experiments.

If mass transfer of reactants or products is the limiting step, then increasing rotational speed would increase the mass transfer and the overall dissolution rate. If the mass transfer exceeds the consumption of the acid on the rock surface, then the overall dissolution is independent of rotational speed and known as surface reaction limited (see FIG. 15).

Figure 16:
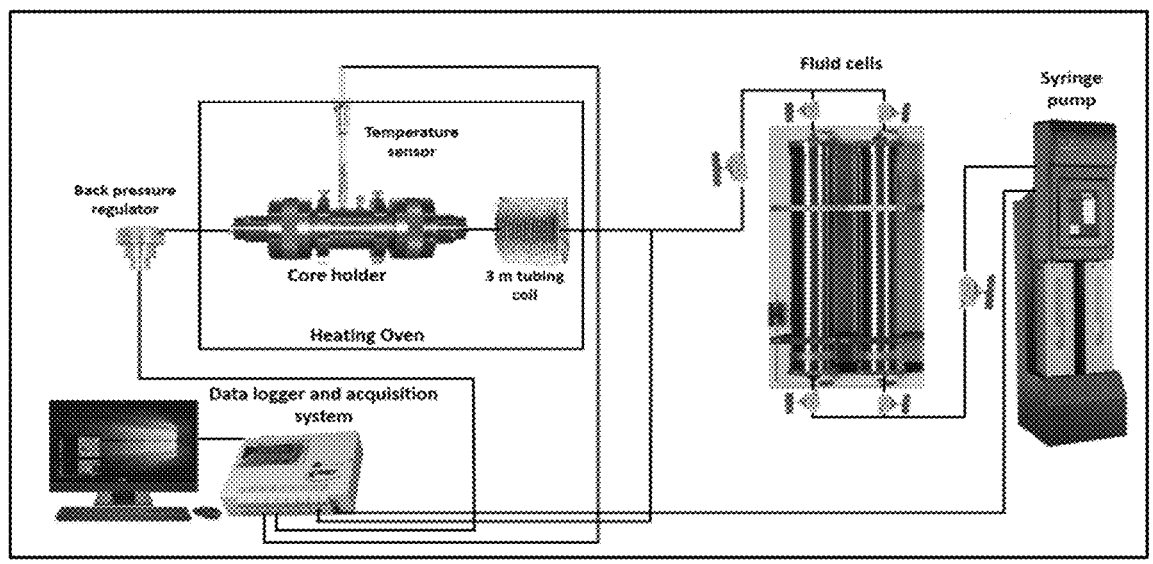
FIG. 16: The scheme of a core-flooding experiment.

An alternative method of core-flooding is disclosed in Mahmoud, M. A. and Nasr-El-Din, H. A. in Modelling Flow of Chelating Agents During Stimulation of Carbonate Reservoirs. *Arab J Sci Eng* (2014) 39: 9239, incorporated herein by reference in entirety. This is considered an accurate method, but it is very tedious (FIG. 16 illustrates the equipment). One major limitation with this method is the rock heterogeneity, especially in carbonate reservoirs. The method assumes that the acid diffuses in a straight path with no tortuosity and this does not apply on the case of actual heterogeneous carbonate reservoirs.

In other non-limiting embodiments, the corrected NMR-derived acidic diffusion coefficients are suitable for determining the acid optimum injection rate that will create dominant channels in the rock.

NMR-derived diffusion coefficients are also suitable for improving the group of processes include: removing damage, determining the rock tortuosity, monitoring and evaluating the acid treatment in real-time using NMR logging tool downhole, monitoring the acid diffusion in real-time in carbonate and sandstone formation using NMR downhole tools, determining the diffusion coefficient required to design the carbonate scale removal from the well tubulars, determining the diffusion coefficient required to design the iron sulphide scale removal from the well tubulars, determining the diffusion coefficient required to design the sulfate scale removal from the well tubulars, designing the carbonate filter cake removal from the well, designing the barium sulfate filter cake removal from the well, determining the diffusion coefficient required to design the barium sulfate filter cake removal from the well, determining the diffusion coefficient required to design the damage removal from sandstone and carbonate formation, determining the diffusion coefficient required to design the acid fracturing operations and acid etching in carbonate and tight carbonate formations, determining the diffusion coefficient required to design the acid fracturing operations in unconventional shale formations, without limitation.

Having generally described this disclosure, a further understanding can be obtained by reference to certain specific examples which are provided herein for purposes of illustration only and are not intended to be limiting unless otherwise specified.

Example 1: Conducting Pulse Nmr on the Porous Acidified Formation

Indiana limestone cylindrical plugs were used for all NMR measurements with 1.5-inch diameter by 2-inch long. Indiana limestone was chosen because it was used in studying the restricted diffusion using different techniques. Also, it has long NMR relaxation times and small internal gradients (due to large grain size and very low paramagnetic content). The samples have porosity of 16% and permeability of 110 mD. (millidarcy).

Figure 17:
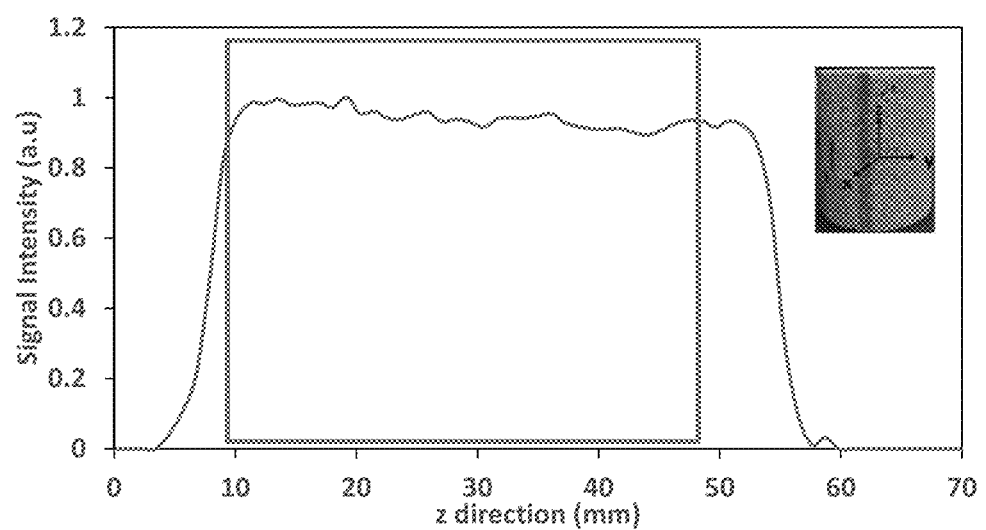
FIG. 17: Saturation Profile of the Indiana rock core saturated with 5 wt % GLDA in Sea Water.

The rock core samples were saturated with two different fluids: 5 wt % of GLDA (N, N-Dicarboxymethyl glutamic acid) in de-ionized water and 5 wt % of GLDA in seawater. The individual rock core was initially placed in a desiccator and vacuumed for 6 hours using a vacuum pump. The fluid is then poured inside the desiccator to cover the whole rock core whilst under vacuum for 36 hours. After fully saturating the rock core, a one-dimensional saturation profile measurement is performed using the NMR relaxometry. The saturation profile results in 30-40 data points along the length of the core sample to check the uniformity of the fluid saturation (FIG. 17)

PFG-NMR experiments were carried out on an Oxford Instruments NMR Rock Core Analyzer MARAN DRX 12.2 MHz coupled with a 5.3-cm I.D radiofrequency coil and three-dimensional magnetic field gradients strength up to 30 G/cm. The 13-interval Bipolar Gradients pulse sequence (APFGSTE) was applied to avoid unnecessary signal attenuation and therefore producing a predictable error in the measurements of the restricted diffusion coefficient, $D_R$, due to the susceptibility difference which causes internal magnetic field gradients. The signal attenuation $(S/S_0)$ for the 13-interval APGSTE sequence is given by:

$$\frac{S}{S_0} = \exp\left\{-D_R\gamma^2\left[\delta^2\left(4\Delta + 6\lambda - \frac{2\delta}{3}\right)g_a^2 + 2\lambda\delta(\delta_1 - \delta_2)g_a g_0 + \frac{4}{3}\lambda^3 g_0^2\right]\right\} \quad (23)$$

Where $S_0$=NMR signal in the absence of applied magnetic field gradients (μV). $D_R$=Restricted self-diffusion coefficient of the fluid (m²/s), $\Delta$ is the duration between two applied magnetic field 'Diffusion Time' (msec), $\delta$ is the duration of the applied magnetic field gradient (msec). $\gamma$ is the gyromagnetic ratio of the nucleus under the study (=2.68×10⁸ Hz/T for ¹H nucleus). $g_a$ is the strength of the applied magnetic field gradient (T/m), $g_0$=strength of the internal magnetic field gradient (T/m). $\lambda$ is the time between the first two (π/2) RF pulses (msec), and $\delta_1$ and $\delta_2$=pre- and post-pulse time, respectively (msec).

By choosing the same value for the two time periods $\delta_1$ and $\delta_2$ and selecting diffusion time larger than the time between the first two (π/2) RF pulses, the previous equation can be expressed as follows enabling $D_R$ to be measured from the slope of the natural logarithm of the signal attenuation versus-b'.

$$\frac{S}{S_0} = \exp\left\{-D_R\gamma^2\left[\delta^2\left(4\Delta + 6\lambda - \frac{2\delta}{3}\right)g_a^2\right]\right\} = \quad (24)$$
$$\exp\left(-D_R(2\delta\gamma g_a)^2\left(\Delta - \frac{3}{2}\lambda - \frac{\delta}{6}\right)\right)$$

where $b' = (2\delta\gamma g_a)^2\left(\Delta - \frac{3}{2}\lambda - \frac{\delta}{6}\right)$ 21 gradient steps were acquired at observation time equals 800 msec. The gradient list covered the range from 0 to 17 G/cm using spacing linear between gradient strengths, the gradient duration was set to 3 ms in all experiments.

Example 2: Results of Pulse Nmr

In order to ensure the uniform and the full saturation of the pore space of the rock core plugs by the fluids, the NMR saturation profile was performed. Regarding the axial saturation profile, FIG. 16 shows a uniform distribution of fluid along the z-direction of the rock core. This is especially true for the strength of NMR detection signal enclosed in the red square representing the full length of the core. The uniform fluid distribution is essential to the measurements of restricted diffusion coefficient.

Figure 18:
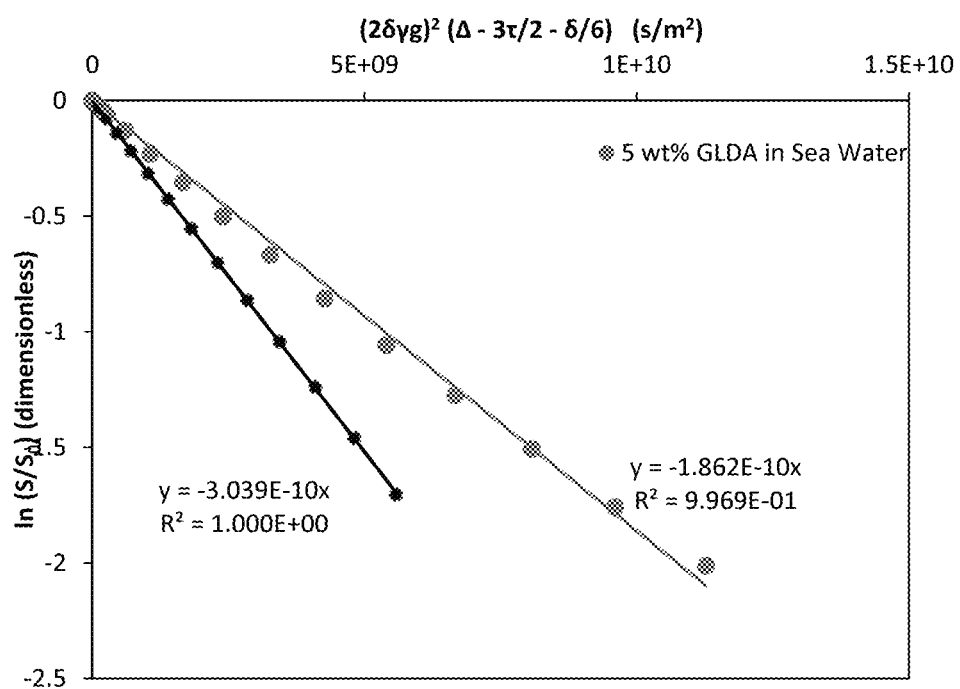
FIG. 18: Indiana Limestone rock core signal attenuation curves from the APFGSTE diffusion NMR experiments.

FIG. 18 shows the measured signal attenuation curves for Indiana limestone saturated with 5 wt % of GLDA in, respectively, de-ionized water and 5 wt % of GLDA in sea water. A mono-exponential fit can describe the decay in the NMR signal and a value of restricted diffusion $(D_R)$ could be calculated from the slope of the plot. Both experiments were done at 800 msec to ensure that the diffusing molecules experience most of pore walls on their movement through the pore space and the restricted diffusion is no longer decreasing.

The diffusion coefficient in case of GLDA in de-ionized water (3.04×10¹⁰ m²/s) is larger compared to GLDA in sea water (1.86×10⁻¹⁰ m²/s). A reasonable explanation of this is the chemical species diffusion is kept by the salts in the GLDA in sea water solution. On the other hand, GLDA in de-ionized water has more freedom to diffuse.

NMR restricted diffusion measurements can be used to determine the optimum injection rate for acid fracturing, acidizing, scale removal, formation damage removal, filter cake removal as follows:

$$Q_{opt} = 102\tau L_{core} D_{restricted} \qquad (25)$$

Both τ (rock tortuosity) and $D_{restricted}$ (restricted diffusion) can be determined from NMR measurements. $L_{core}$ is the core length in the laboratory or the damage length in the reservoir.

Example 3: Comparison of Nmr-Derived and Rotating Disk Derived Diffusion Coefficients The following table shows the diffusion coefficient determined from the NMR and rotating disk methods.

TABLE 1

Diffusion coefficient for GLDA chelating agent at pH 4, 5 wt %.

| Diffusion Coefficient from Rotating Disk, cm²/sec | | Diffusion Coefficient from NMR, cm²/sec | |
|---|---|---|---|
| 5 wt % GLDA/ Seawater | 5 wt % GLDA/ fresh water | 5 wt % GLDA/ Seawater | 5 wt % GLDA/ fresh water |
| $2 \times 10^{-6}$ | $3.2 \times 10^{-6}$ | $1.86 \times 10^{-6}$ | $3.04 \times 10^{-6}$ |

As shown in the previous table, NMR was run for the GLDA inside the rock sample and at atmospheric conditions and the rotating disk was at 1000 psi and 200° F. and produce very similar values. The ratio of the diffusion coefficient in the right half of the table to that in the left half characterizes the deviation of NMR values from the rotating disk values. While in the laboratory conditions the deviation is minimal, in the downhole conditions the discrepancy can increase (see the factors above).

Example 4: Use of the Diffusion Coefficients for Modelling the Stimulation Process The optimum injection rate to produce wormholes with optimum density and penetration depth into the formation depends on the reaction and diffusion rates of the acid species, concentration of the acid, length of the core sample, temperature, permeability of the medium. The relative increase in permeability, pore radius and interfacial area with respect to their initial values are related to porosity in the following manner:

$$\frac{K}{K_o} = \frac{\varepsilon}{\varepsilon_o} \left( \frac{\varepsilon(1-\varepsilon_o)}{\varepsilon(1-\varepsilon)} \right)^{2\beta}. \qquad (26)$$

$$\frac{r_p}{r_o} = \sqrt{\frac{K\varepsilon_o}{K_o\varepsilon}} \text{ and} \qquad (27)$$

$$\frac{a_v}{a_o} = \frac{\varepsilon r_o}{\varepsilon_o r_p}. \qquad (28)$$

Where e is the final value of porosity, $e_0$ is the initial value of porosity, $K_o$, $r_o$ and $a_o$ are the initial values of permeability, average pore radius and interfacial area, respectively. Correspondingly K, $r_p$ and $a_v$ are the permeability, average pore radius and interfacial area after acidification. For developing flow inside a straight pore of arbitrary cross-section, a good approximation to the Sherwood number, the dimensionless mass transfer coefficient, is given by:

$$Sh = \frac{2 k_c r_p}{D_m} = Sh_\infty + 0.35 \left( \frac{d_h}{x} \right)^{0.5} Re_p^{1/2} Sc^{1/3} \qquad (29)$$

Where $k_c$ is the mass transfer coefficient, $r_p$ is the pore radius and $D_m$ is molecular diffusivity, $Sh_\infty$ the asymptotic Sherwood number for the pore, $Re_p$ is the pore Reynolds number, $d_h$ is the pore hydraulic diameter, x is the distance from the pore inlet and Sc is the Schmidt number (Sc=µ/Dm; where µ is the kinematic viscosity of the fluid).

Assuming the length of a pore is typically a few pore diameters, the average mass transfer coefficient can be obtained by integrating the above expression over a pore length and is given by $$Sh = Sh_\infty + b Re_p^{1/2} Sc^{1/3} \qquad (30)$$

where the constants $Sh_\infty$ and b (=0.7/m^{0.5}), m=pore length to diameter ratio) depend on the structure of the porous medium (pore cross sectional shape and pore length to hydraulic diameter ratio). Equation (29) is of the same general form as the Frossling correlation used extensively in correlating mass transfer coefficients in packed beds. For a packed bed of spheres, $Sh_c$=2 and b=0.6, this value of b is close to the theoretical value of 0.7 predicted by Equation (30) for m=1. The two terms on the right-hand side in correlation (30) are contributions to the Sherwood number due to diffusion and convection of the acid species, respectively. While the diffusive part, $Sh_\infty$, depends on the pore geometry, the convective part is a function of the local velocity. The asymptotic Sherwood number for pores with the cross-sectional shape of square, triangle and circle are 2.98, 2.50 and 3.66, respectively. Since the value of asymptotic Sherwood number is a weak function of the pore geometry, a typical value of 3.0 may be used for the calculations. The convective part depends on the pore Reynolds number and the Schmidt number. For liquids, the typical value of Schmidt number is around one thousand and assuming a value of 0.7 for b, the approximate magnitude of the convective part of Sherwood number from Equation (30) is $7 Re_p^{1/2}$. The pore Reynolds numbers are very small due to the small pore radius and the low injection velocities of the acid, making the contribution of the convective part negligible during initial stages of dissolution. As dissolution proceeds, the pore radius and the local velocity increase, making the convective contribution significant. Inside the wormhole, where the velocity is much higher than elsewhere in the medium, the pore level Reynolds number is high and the magnitude of the convective part of the Sherwood number could exceed the diffusive part. The effect of this change in mass transfer rate due to convection on the acid concentration may not be significant because of the extremely low interfacial area in the high porosity regions. Though the effect of convective part of the mass transfer coefficient on the acid concentration inside the wormhole is expected to be negligible, it is important in the uniform dissolution regime and to study the transitions between different reaction regimes occurring in the medium due to change in mass transfer rates. The effect of reaction kinetics on the mass transfer coefficient is observed to be weak. For example, the asymptotic Sherwood number varies from 48/11 (=4.36) to 3.66 for the case of very slow reaction to very fast reaction.

For homogeneous, isotropic porous media, the dispersion tensor is characterized by two independent components, namely, the longitudinal, $D_{eX}$ and transverse, $D_{eT}$, dispersion coefficients. In the absence of flow, dispersion of a solute occurs only due to molecular diffusion and $D_{eX}=D_{eT}=a_o D_m$, where $D_m$ is the molecular diffusion coefficient and $a_o$ is a constant that depends on the structure of the porous medium (e.g., tortuosity). With flow, the dispersion tensor depends on the morphology of the porous medium as well as the pore level flow and fluid properties. In general, the problem of relating the dispersion tensor to these local variables is rather complex and is analogous to that of determining the permeability tensor in Darcy's law from the pore structure. According to a preferred embodiment of the present invention, only simple approximations to the dispersion tensor are considered.

To achieve a fixed increase in the permeability, a large volume of acid is required in the uniform dissolution regime where the acid escapes the medium after partial reaction. Similarly, in the face dissolution regime, a large volume of acid is required to dissolve the entire medium. In the wormholing regime only a part of the medium is dissolved to increase the permeability by a given factor, thus, decreasing the volume of acid required than that in the face and uniform dissolution regimes. The economic aspect is realized by minimizing the quantity of the acid reactant per the fixed increase in permeability.

At very high injection rates, the residence time of the acid is very short compared to the reaction time, and most of the acid escapes the medium without reacting. Because the conversion of the acid is low, the concentration in the medium could be approximated as the inlet concentration. Under these assumptions, the model may be reduced to the relationship:

$$\frac{\partial \varepsilon}{\partial t} = \frac{k_3 C_o a_r \alpha}{\rho_s \left(1 + \frac{\phi^2 r}{Sh}\right)}. \tag{31}$$

Where $C_O$ is the inlet concentration of acid, $k_s$ is the kinetic constant, a, $a_v$ are the porosity and tortuosity constants, $\rho_s$ is the density of the material, Sh is the Sherwood number.

The optimum injection rate and minimum volume of acid which arise due to channeling are dependent on the dimension of the model. If the length of the front in the medium ahead of the tip where the acid is consumed is denoted by $l_X$, and the front length in the transverse direction by $l_T$, a qualitative criterion for different dissolution patterns can be given by:

$$\frac{l_T}{l_X} \gg O(I) \Rightarrow \text{Face dissolution} \tag{32}$$

$$\frac{l_T}{l_X} \sim O(I) \Rightarrow \text{Wormhole. and} \tag{33}$$

$$\frac{l_T}{l_X} \ll O(I) \Rightarrow \text{Uniform dissolution.} \tag{34}$$

Equations (32)-(34) can be qualitatively restated as a ratio of the range where the acid decreases its concentration from the bulk to the zero to the distance it travels from the cylindrical borehole in the formation. Herein "wormhole" is defined as a large pore or channel developing through an element of formation instead of a steady increase of multiple small pore diameters. According to Darcy equation, the same amount of acid consumed by the formation of a wormhole leads to a greater hydrocarbon flow than possible due to the steady increase of multiple pore sizes accomplished by the same consumed amount of acid.

The critical parameters determining economic efficiency in (32)-(34) can be found from the combination of reactivity, convection and diffusivity data.

$$\Lambda = \frac{l_T}{l_X} = \frac{\sqrt{k_{\mathit{eff}} D_{eT}}}{n_{tip}} \tag{35}$$

Where: $k_{\mathit{eff}}$ is the effective rate constant of chemical reaction, $(D_{eT})$ is the effective transverse dispersion coefficient combining the individual diffusion coefficients in all three dimensions, and $u_{tip}$ is the injection velocity of the fluid at the tip of the wormhole. The optimum rate for the formation of wormholes is computed by setting $\Lambda$ in the range $0.1<\Lambda<5$. The equations (31)-(34) thus demonstrate the need of at precise determining of the dispersion coefficient, which in turn is a function of the anisotropic diffusion coefficients.

The invention claimed is:

1. An acid injection method including adjusting one or more acid injection parameters for injecting an acid mixture into a geological formation for acid treatment, comprising:
   determining diffusion coefficients in a rock matrix of the geological formation by:
   a) exposing a portion of the rock matrix to a constant magnetic field to achieve equilibrium magnetization of nuclei of an acid present in the rock matrix;
   b) exposing the rock matrix to a radiofrequency (RF) pulse deflecting the magnetization vector of the nuclei from the equilibrium value;
   c) providing a well-defined timing post RF pulse;
   d) subjecting the rock matrix to a magnetic gradient pulse;
   e) providing a well-defined timing post magnetic gradient pulse;
   f) providing a refocusing RF pulse, followed by a well-defined time interval;
   g) providing a refocusing magnetic gradient pulse, followed by a well-defined time interval;
   h) measuring the chemical shifts and signal intensity of the nuclei of the acid after all re-focusing pulses at a well-defined moment of time;
   i) repeating (a)-(h) at different values of the magnetic gradient pulse;
   j) controlling the timing between the radiofrequency pulses and magnetic gradient pulses;
   k) determining the diffusion coefficients from the information resulting from (a)-(j); and
   injecting the acid mixture into the geological formation at a rate, pressure or flow based on the diffusion coefficients.

2. The method of claim 1, wherein (a)-(j) are an APGASTE sequence with the determining (k) is carried out with the Stejskal and Tanner equation:

$$\frac{S}{S_0} = \exp\left\{-D_R \gamma^2 \left[\delta^2\left(4\Delta + 6\lambda - \frac{2\delta}{3}\right)g_a^2 + 2\lambda\delta(\delta_1 - \delta_2)g_a g_0 + \frac{4}{3}\lambda^3 g_0^2\right]\right\}$$

where $S_0$=NMR signal in the absence of applied magnetic field gradients (μV), $D_R$=Restricted self-diffusion coefficient of the fluid (m²/s), Δ is the duration between two applied magnetic field 'Diffusion Time' (msec), δ is the duration of the applied magnetic field gradient (msec), γ is the gyromagnetic ratio of the nucleus being studied (=2.68×10⁸ Hz/T for ¹H nucleus), $g_a$ is the strength of the applied magnetic field gradient (T/m), $g_o$ is the strength of the internal magnetic field gradient (T/m), λ is the time between the first two (π/2) RF pulses (msec), and $δ_1$ and $δ_2$=pre- and post-pulse time respectively (msec).

3. The method of claim 2, wherein the diffusion coefficient of an acidity-mediating species is deconvoluted from other contributions in the overall signal using the DOSY methodology.

4. The method of claim 1, wherein the diffusion coefficient is determined in-situ under downhole conditions using a downhole sensor assembly comprising an NMR apparatus.

5. The method of claim 1, wherein the data are corrected by the data of rotating-disk experiments collected in laboratory conditions using analogous systems, wherein the group of factors consists of the combination of all: similar carbonate samples, similar porosity, tortuosity, acid composition of the stimulant fluid, the injection rate, the presence of detergents and emulsifiers, the temperature, viscosity and pressure, the extent of hydrocarbon permeation of the porous rock, the extent of asphaltene content in the hydrocarbon, convection of the fluid flow, Reynolds criterion value, the rate of chemical reaction.

6. The method of claim 5, wherein the corrective procedure comprises:

a) measuring the acidity diffusion coefficient by an NMR method in the laboratory for a given set of conditions and rock composition;

b) measuring the acidity diffusion coefficient by rotating disk method for the same set of conditions as in (a);

c) relating the NMR-derived diffusion coefficient to the rotating disk derived coefficient;

d) producing a correction for the NMR-derived value according to (c);

e) repeating the steps (a)-(d) with an alternative and distinct set of conditions, where the distinction is in more than 80% of all parameters at the same time;

f) repeating the step (e) n×P times, where n>1 and P is the number of controlled parameters in the rotation disk experiment;

g) using the data of the step (f) to derive a multivariate regression model linking the corrections for the NMR-derived acidic diffusion coefficients and the conditions that impact these diffusion coefficients;

h) measuring the in-situ conditions during the drilling process and identifying the nearest set in the laboratory-derived library of the experiments (a)-(g);

i) using the nearest set of (h) as a starting point to extrapolate the correction most relevant to the in-situ conditions by applying the model in (g);

j) apply the extrapolated value of the correction to modify the in-situ measured NMR-derived acidic diffusion coefficient.

7. The method of claim 6, wherein the adjusted acidic diffusion coefficient is incorporated in a mathematic model of economic efficiency for the formation stimulation.

8. The method of claim 7, wherein the economically critical parameter is the acid injection rate in the formation.

9. The method of claim 1, wherein the method relies on the sequences in the group comprising:

Hahn stimulated echo (STE);
LED (longitudinal encode decode) pulse sequence;
Bipolar gradient longitudinal encode-decode pulse sequence (BPP-LED);
Gradient compensated stimulated spin-echo pulse sequences (GCSTE);
The double stimulated echo sequence (DSTE).

10. The method of claim 7, wherein the economic model comprises determining the conditions of stimulating the formation in a wormhole regime.

11. The method of claim 10, wherein the conditions for entering the wormhole regime are the critical parameters determining economic efficiency and these parameters can be found from the combination of reactivity, convection and diffusivity data:

$$\Lambda = \frac{l_T}{l_X} = \frac{\sqrt{k_{\text{eff}} D_{eT}}}{n_{tip}}$$

where: $k_{\text{eff}}$ is the effective rate constant of chemical reaction, $(D_{eT})$ is the effective transverse dispersion coefficient combining the individual diffusion coefficients in three dimensions, and $u_{tip}$ is the injection velocity of the fluid at the tip of the wormhole, wherein the optimum rate for the formation of wormholes is computed by setting Λ in the range 0.1<Λ<5.

12. The method of claim 6, wherein the NMR-derived diffusion coefficients are applied for optimizing the group of processes consisting of: removing damage, determining the rock tortuosity, monitoring and evaluating the acid treatment in real-time using NMR logging tool downhole, monitoring the acid diffusion in real-time in carbonate and sandstone formation using NMR downhole tools, determining the diffusion coefficient required to design the carbonate scale removal from the well tubulars, determining the diffusion coefficient required to design the iron sulphide scale removal from the well tubulars, determining the diffusion coefficient required to design the sulfate scale removal from the well tubulars, designing the carbonate filter cake removal from the well, designing the barium sulfate filter cake removal from the well, determining the diffusion coefficient required to design the barium sulfate filter cake removal from the well, determining the diffusion coefficient required to design the damage removal from sandstone and carbonate formation, determining the diffusion coefficient required to design the acid fracturing operations and acid etching in carbonate and tight carbonate formations, determining the diffusion coefficient required to design the acid fracturing operations in unconventional shale formations.

* * * * *